United States Patent
Lee et al.

(10) Patent No.: US 9,728,698 B2
(45) Date of Patent: Aug. 8, 2017

(54) LIGHT EMITTING DEVICE PACKAGE HAVING IMPROVED HEAT DISSIPATION EFFICIENCY

(71) Applicant: Seoul Viosys Co., Ltd., Ansan-si (KR)

(72) Inventors: So Ra Lee, Ansan-si (KR); Chang Yeon Kim, Ansan-si (KR); Ju Yong Park, Ansan-si (KR); Sung Su Son, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 14/730,087

(22) Filed: Jun. 3, 2015

(65) Prior Publication Data
US 2015/0349232 A1    Dec. 3, 2015

(30) Foreign Application Priority Data

Jun. 3, 2014  (KR) .................. 10-2014-0067396
Jul. 18, 2014 (KR) .................. 10-2014-0091227
Jul. 31, 2014 (KR) .................. 10-2014-0098258

(51) Int. Cl.
| | | |
|---|---|---|
| *H01L 33/64* | (2010.01) | |
| *H01L 27/15* | (2006.01) | |
| *H01L 29/861* | (2006.01) | |
| *H01L 33/38* | (2010.01) | |
| *H01L 33/52* | (2010.01) | |
| *H01L 33/62* | (2010.01) | |
| *H01L 27/02* | (2006.01) | |
| *H01L 25/16* | (2006.01) | |
| *H01L 33/48* | (2010.01) | |
| *H01L 33/58* | (2010.01) | |

(52) U.S. Cl.
CPC ........ *H01L 33/647* (2013.01); *H01L 27/0248* (2013.01); *H01L 29/861* (2013.01);
(Continued)

(58) Field of Classification Search
CPC ....... H01L 33/44; H01L 33/502; H01L 33/42; H01L 33/405; H01L 33/24; H01L 33/486;
(Continued)

(56) References Cited

U.S. PATENT DOCUMENTS 6,547,249 B2   4/2003  Collins, III et al.
6,573,537 B1   6/2003  Steigerwald et al.
(Continued)

FOREIGN PATENT DOCUMENTS

TW   201212287   3/2012
TW   M461000    9/2013
(Continued)

OTHER PUBLICATIONS

Kazuya Matsuzawa, Ken Uchida, and Akira Nishiyama, "A Unified Simulation of Schottky and Ohmic Contacts", Jan. 2000, IEEE Transactions on Electron Devices, vol. 47, p. 103-108.*
(Continued)

*Primary Examiner* — Evan Pert
*Assistant Examiner* — Changhyun Yi
(74) *Attorney, Agent, or Firm* — Perkins Coie LLP

(57) ABSTRACT

Exemplary embodiments provide a light emitting diode and a method for manufacturing the same. The light emitting diode includes a light emitting structure, a plurality of holes formed through a second conductive type semiconductor layer and an active layer such that a first conductive type semiconductor layer is partially exposed therethrough, and a first electrode and a second electrode electrically connected to the first conductive type semiconductor layer and the second conductive type semiconductor layer, respectively, while being insulated from each other. The second electrode includes openings corresponding to the plurality of holes, a plurality of unit electrode layers separated from each other, and at least one connection layer electrically connecting at least two unit electrode layers to each other. The first electrode forms ohmic contact with the first conductive type semiconductor layer through the plurality of holes and partially covers the light emitting structure.

24 Claims, 26 Drawing Sheets

(52) U.S. Cl.
CPC ......... *H01L 33/382* (2013.01); *H01L 33/387* (2013.01); *H01L 25/167* (2013.01); *H01L 29/8613* (2013.01); *H01L 33/486* (2013.01); *H01L 33/58* (2013.01); *H01L 33/64* (2013.01); *H01L 2924/0002* (2013.01)

(58) Field of Classification Search
CPC ......... H01L 33/22; H01L 33/46; H01L 27/15; H01L 33/58
USPC ...................................................... 257/91, 98
See application file for complete search history.

(56) References Cited

U.S. PATENT DOCUMENTS

| | | | |
|---|---|---|---|
| 8,242,509 B2 | 8/2012 | Song | |
| 2012/0074441 A1* | 3/2012 | Seo | H01L 27/153 257/91 |
| 2014/0209955 A1* | 7/2014 | Kim | H01L 33/62 257/99 |
| 2015/0021626 A1* | 1/2015 | Nakamura | H01L 33/38 257/79 |

FOREIGN PATENT DOCUMENTS

| | | |
|---|---|---|
| TW | 201349573 | 12/2013 |
| TW | 201407826 | 2/2014 |
| TW | 201414024 | 4/2014 |
| TW | 201424039 | 6/2014 |
| TW | M511125 | 10/2015 |
| TW | M517424 | 2/2016 |

OTHER PUBLICATIONS

Taiwan Intellectual Property Office, Office Action, Taiwan Application No. 10520280240, Mar. 10, 2016, 2 pages.
Taiwan Intellectual Property Office, Office Action, Taiwan Application No. 10520693470, Jun. 4, 2016, 10 pages.
Taiwan Intellectual Property Office, Office Action, Taiwan Application No. 104117701, Oct. 21, 2016, 2 pages.

* cited by examiner (a)

(b)

(a)

(b)

(a)

(b)

(a)

(b)

(a)

(b)

(a)

(b)

(a)

(b)

(a)

(b)

(a)

(b)

(a)

(b)

(a)

(b)

LIGHT EMITTING DEVICE PACKAGE HAVING IMPROVED HEAT DISSIPATION EFFICIENCY

PRIORITY CLAIMS AND CROSS-REFERENCE TO RELATED APPLICATION

This patent document claims priorities and benefits of Korean Patent Application No. 10-2014-0067396, filed on Jun. 3, 2014, Korean Patent Application No. 10-2014-0091227, filed on Jul. 18, 2014, and Korean Patent Application No. 10-2014-0098258, filed on Jul. 31, 2014, the contents of which are incorporated by reference herein in its entirety.

TECHNICAL FIELD

The disclosure of this patent document relates to light emitting diodes and light emitting devices including the same to improve luminous efficacy and heat dissipation efficiency.

BACKGROUND

For a large flip-chip type light emitting diode, current spreading efficiency or current spreading performance is an important factor closely related to luminous efficacy of the light emitting diode. A larger chip area provides a higher possibility of luminous deviation in one chip, and thus current spreading efficiency or current spreading performance has great influence on luminous efficacy of the light emitting diode. In order to improve current spreading efficiency (or performance) and heat dissipation efficiency of such a large flip-chip type light emitting diode, various electrode structures and semiconductor layer structures have been proposed.

SUMMARY

Exemplary embodiments provide a light emitting diode capable of minimizing reduction of a light emitting area.

Exemplary embodiments provide a light emitting diode having improved current spreading efficiency or current spreading performance.

Exemplary embodiments provide a method for manufacturing a light emitting diode, which provides a simple manufacturing process and can improve current spreading efficiency or current spreading performance while minimizing reduction in area of an active layer.

Exemplary embodiments provide a light emitting diode having improved heat dissipation efficiency and a light emitting device including the same.

Exemplary embodiments provide a method for manufacturing a light emitting device having improved heat dissipation efficiency through a simple process.

Exemplary embodiments provide a light emitting diode chip incorporating a protection device to omit a separate protection device, and a light emitting device including the same.

Exemplary embodiments provide a light emitting device that is provided with a light emitting diode chip including a protection device, and has luminous uniformity and a wide beam angle.

In one aspect, a light emitting device is provided to comprise: a substrate including a base and a conductive pattern disposed over the base; and a light emitting diode mounted on the substrate, wherein the light emitting diode includes: a light emitting structure including a first conductive type semiconductor layer, a second conductive type semiconductor layer disposed under the first conductive type semiconductor layer, and an active layer disposed between the first conductive type semiconductor layer and the second conductive type semiconductor layer, wherein the light emitting structure is disposed to form openings exposing a corresponding portion of the first conductive type semiconductor layer; a first electrode forming ohmic contact with the first conductive type semiconductor layer through the exposed portion of the first conductive type semiconductor layer; a second electrode disposed under the second conductive type semiconductor layer and forming ohmic contact with the second conductive type semiconductor layer; a first insulation layer partially covering the first electrode and the second electrode; a first bump and a second bump disposed under the light emitting structure and electrically connected to the first electrode and the second electrode, respectively through the conductive pattern; and a heat dissipation bump disposed under the light emitting structure and contacting the base, wherein at least one of the openings formed on the light emitting structure is disposed to form a connection structure connecting at least two other of the openings, the first bump, the second bump and the heat dissipation bump are separated from one another, and the heat dissipation bump has higher thermal conductivity than the first and second bumps.

In some implementations, the light emitting diode further includes an insulation layer covering side surfaces of the first bump, the second bump and the heat dissipation bump. In some implementations, a lower surface of the insulation layer, a lower surface of the first bump, a lower surface of the second bump, and a lower surface of the heat dissipation bump are flush with one another. In some implementations, the base includes a protrusion and an upper surface of the protrusion is flush with an upper surface of the conductive pattern. In some implementations, at least one of the first bump, the second bump, or the heat dissipation bump includes solders. In some implementations, the heat dissipation bump is disposed between the first bump and the second bump. In some implementations, the conductive pattern includes a first conductive pattern electrically connected to the first bump and a second conductive pattern electrically connected the second bump, and the base includes a protrusion disposed between the first and second conductive patterns. In some implementations, the light emitting diode further includes an insulation layer disposed between the light emitting structure and the heat dissipation bump. In some implementations, the first and second bumps are bonded to the conductive pattern. In some implementations, the light emitting device further includes an insulation pattern disposed between the base and the conductive pattern, wherein the base and the conductive pattern include metal. In some implementations, the second electrode has a monolithic structure. In some implementations, the first bump and the second bump directly contact a portion of the first electrode and a portion of the second electrode, respectively.

In another aspect, a light emitting diode is provided to comprise: a light emitting structure including a first conductive type semiconductor layer, a second conductive type semiconductor layer disposed under the first conductive type semiconductor layer, and an active layer disposed between the first conductive type semiconductor layer and the second conductive type semiconductor layer, the active layer and the second conductivity type semiconductor layer of the light emitting structure are disposed to form openings to expose a portion of the lower surface of the first conductive type semiconductor layer through the active layer and the second conductive type semiconductor layer; a first electrode forming ohmic contact with the first conductive type semiconductor layer through the exposed portion of the first conductive type semiconductor layer; a second electrode disposed under the second conductive type semiconductor layer and forming ohmic contact with the second conductive type semiconductor layer; a first insulation layer partially covering the first electrode and the second electrode; a first bump and a second bump disposed under the light emitting structure and electrically connected to the first electrode and the second electrode, respectively; and a heat dissipation bump disposed under the light emitting structure, wherein at least one of the openings exposing the portion of the first conductive type semiconductor layer is disposed to connect at least two other of the openings, the first bump, the second bump and the heat dissipation bump are separated from one another, and the heat dissipation bump has higher thermal conductivity than the first and second bumps.

In some implementations, the light emitting diode further includes: an insulation layer covering side surfaces of the first bump, the second bump and the heat dissipation bump. In some implementations, at least one of the first bump, the second bump, or the heat dissipation bump includes solders. In some implementations, the heat dissipation bump is disposed between the first bump and the second bump. In some implementations, the light emitting diode further includes: an insulation layer disposed between the light emitting structure and the heat dissipation bump.

In another aspect, a light emitting device is provided to comprise: a first mesa and a second mesa, each including a first conductive type semiconductor layer, a second conductive type semiconductor layer, and an active layer interposed between the first and second conductive type semiconductor layers, wherein the first mesa and the second mesa are formed in a light emitting diode region and a protective diode region, respectively, and the first mesa and the second mesa are disposed to expose the corresponding first conductive semiconductor layer in the light emitting diode region and the protective diode region; a second electrode formed over the first mesa and the second mesa and electrically connected to the second conductive type semiconductor layer in the light emitting diode region and the protective diode region; a first insulation layer covering portions of the first mesa and the second mesas, wherein the first insulation layer is disposed to form openings exposing the first conductive type semiconductor layer and the second electrode in the light emitting diode region and the protective diode region; a first electrode disposed over a portion of the first insulation layer and electrically connected to the first conductive type semiconductor layer of the light emitting diode region and the second electrode of the protective diode region through some of the openings in the first insulating layer; a connection electrode disposed over another portion of the first insulation layer and electrically connected to the first conductive type semiconductor layer of the protective diode region and the second electrode of the light emitting diode region through some other of the openings in the first insulating layer; and a second insulation layer formed to cover at least a portion of the first insulation layer and the connection electrode.

In some implementations, the second insulation layer is disposed to form openings exposing the first insulation layer in the light emitting diode region and the protective diode region. In some implementations, the light emitting device further comprises: a first electrode pad and a second electrode pad formed over the second insulation layer, the first electrode pad being electrically connected to the first electrode through one of the openings and the second electrode pad being electrically connected to the connection electrode through another of the openings.

According to the exemplary embodiments, a light emitting diode including a structure forming ohmic contact with a first conductive type semiconductor layer through a plurality of holes to minimize reduction in light emitting area is provided. In addition, a light emitting diode having improved current spreading efficiency (or performance) and luminous uniformity is provided. Further, a method for manufacturing a light emitting diode, which can simplify manufacture of the light emitting diode through simultaneous formation of part of a first electrode and part of a second electrode, is provided.

Further, according to the exemplary embodiments, a light emitting diode including a heat dissipation electrode having relatively high thermal conductivity to improve heat dissipation efficiency and a light emitting device including the same are provided. As a result, it is possible to simplify the process of manufacturing a light emitting device using bumps and heat dissipation electrode solders while improving reliability of the manufactured light emitting device.

Further, according to the exemplary embodiments, a light emitting diode chip incorporating a protective diode is provided, thereby eliminating a need for a separate protective circuit in the light emitting device. As a result, the exemplary embodiments can reduce manufacturing costs of the light emitting device while simplifying the manufacture process, thereby improving yield. Furthermore, a light emitting device in which a protective diode region PR corresponding to a dark portion of a light emitting diode chip is vertically aligned with a center of an upper concave section of a lens is provided. With this structure, the light emitting device can provide uniform beam distribution of light emitted through an upper surface of the lens, minimize reduction in luminous uniformity, which can be caused by the dark portion created by the protective diode region in the light emitting diode chip, and can more effectively prevent light from concentrating on an upper portion of the center of the lens upon light emission of the light emitting device.

BRIEF DESCRIPTION OF DRAWINGS

The accompanying drawings, which are included to provide a further understanding of the disclosed technology, and are incorporated in and constitute a part of this specification, illustrate exemplary embodiments of the disclosed technology, and together with the description serve to explain the principles of the disclosed technology.

DETAILED DESCRIPTION

Figure 1A:
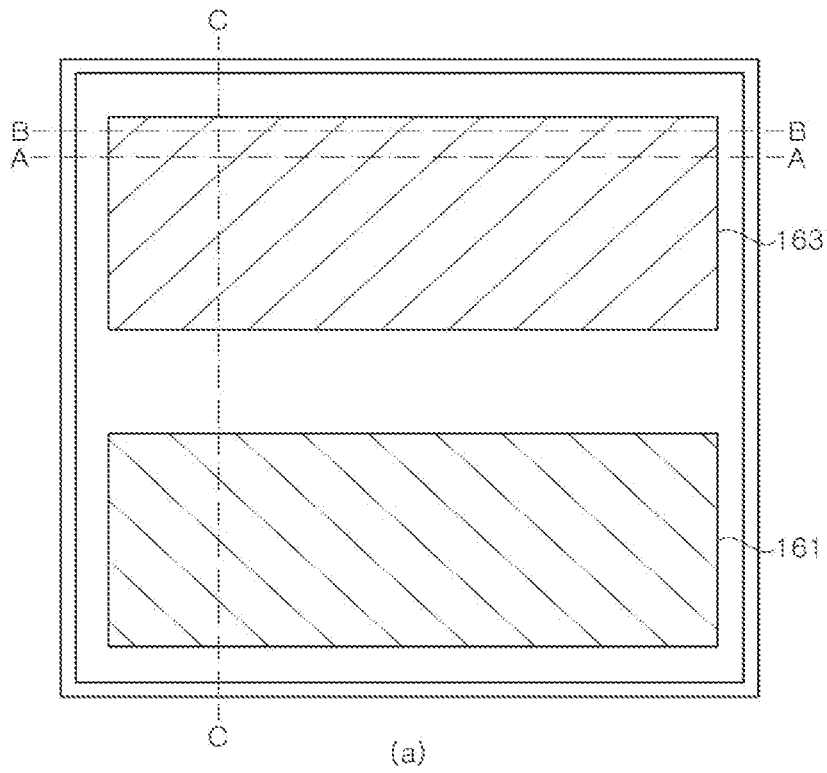
FIG. 1(a) through FIG. 4 are plan views and sectional views of an exemplary light emitting diode according to some exemplary embodiments.

Hereinafter, embodiments of the present disclosure will be described in detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of elements can be exaggerated for clarity and descriptive purposes. When an element or layer is referred to as being "disposed above" or "disposed on" another element or layer, it can be directly "disposed above" or "disposed on" the other element or layer or intervening elements or layers can be present. Throughout the specification, like reference numerals denote like elements having the same or similar functions.

A conventional technique for improving current spreading efficiency (or performance) and heat dissipation efficiency is to employ linear extensions, which have high resistance. Thus, there has been a limit to improve current spreading. Moreover, since a reflective electrode is restrictively disposed on a p-type semiconductor layer, a substantial amount of light is lost due to pads and extensions instead of being reflected by the reflective electrode. In addition, since current crowding occurs depending upon locations of an N-electrode and a P-electrode, the light emitting diode has a region having very low luminous efficacy.

However, linear extensions included in some light emitting diodes, which have high resistance, and thus has a limit in improvement of current spreading. Moreover, since a reflective electrode is restrictively disposed on a p-type semiconductor layer, a substantial amount of light is lost due to pads and extensions instead of being reflected by the reflective electrode. In addition, since current crowding occurs depending upon locations of an N-electrode and a P-electrode, the light emitting diode has a region having very low luminous efficacy.

Moreover, in order to form the N-electrode, the light emitting diode has a relatively large area through which the n-type semiconductor layer is exposed. This structure results in reduction of a light emitting area, and deteriorates overall luminous efficacy and luminous intensity of the light emitting diode.

Moreover, in a typical light emitting device, electrodes are formed in a large area in order to improve heat dissipation efficiency of the light emitting diode. However, since first and second electrodes of the light emitting diode are mounted on a secondary substrate by solder bonding, a large area of the electrodes provides a higher possibility of electric short in the course of solder bonding. As a result, a light emitting device can suffer from failure and deterioration in reliability.

Moreover, as described above, as output of the light emitting diode increases, there is an increasing need for anti-electrostatic capabilities in order to prevent failure of the light emitting diode by electrostatic discharge. In order to prevent failure of the light emitting diode by electrostatic discharge, a separate protection device (for example, a Zener diode) is provided together with the light emitting diode in the same package in a packaging process of the light emitting diode. For example, Korean Patent Laid-open Publication No. 10-2011-0128592 and the like disclose a light emitting diode package that includes a light emitting diode and a Zener diode.

However, the Zener diode is expensive and requires a mounting process, thereby causing increase in the number of packaging processes and manufacturing costs. In addition, since the Zener diode is placed near the light emitting diode within the light emitting diode package, the package has further reduced luminous efficacy due to light absorption by the Zener diode, thereby causing reduction in yield of the light emitting diode package. Moreover, the light emitting diode package can suffer from uneven light emission depending upon a location of the Zener diode.

Figure 1B:
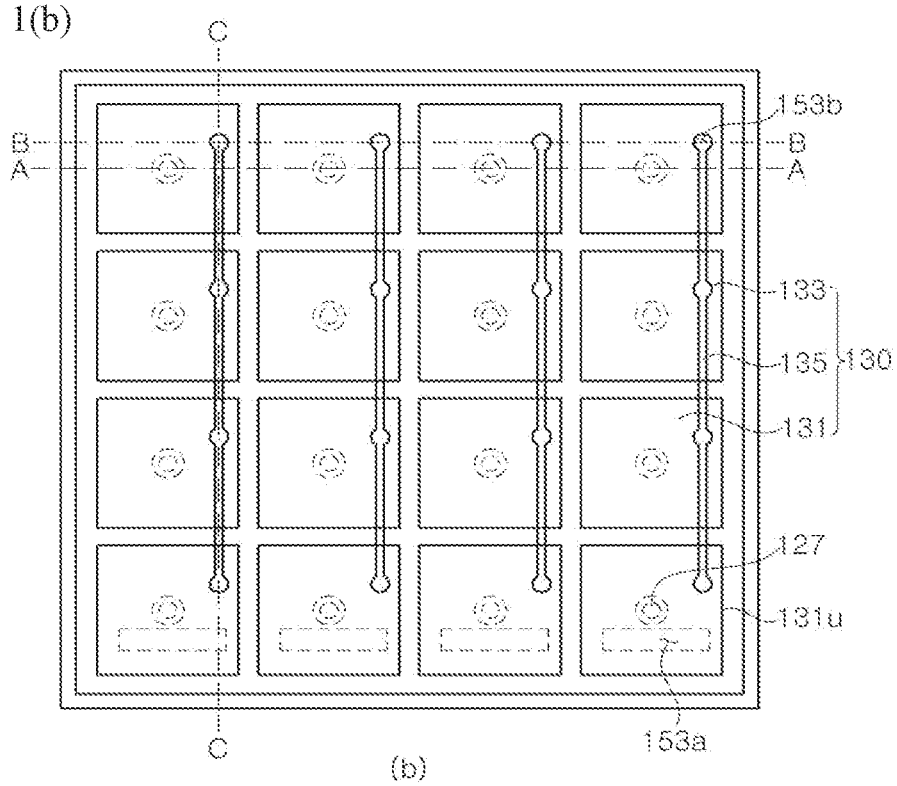
Figure 2:
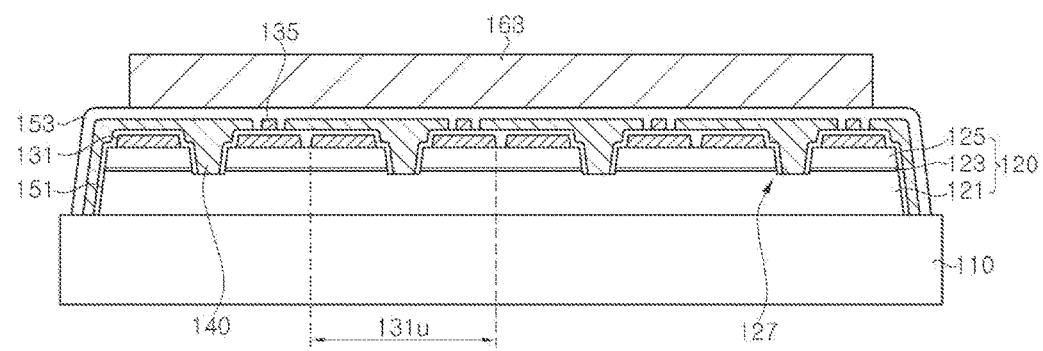
Figure 3:
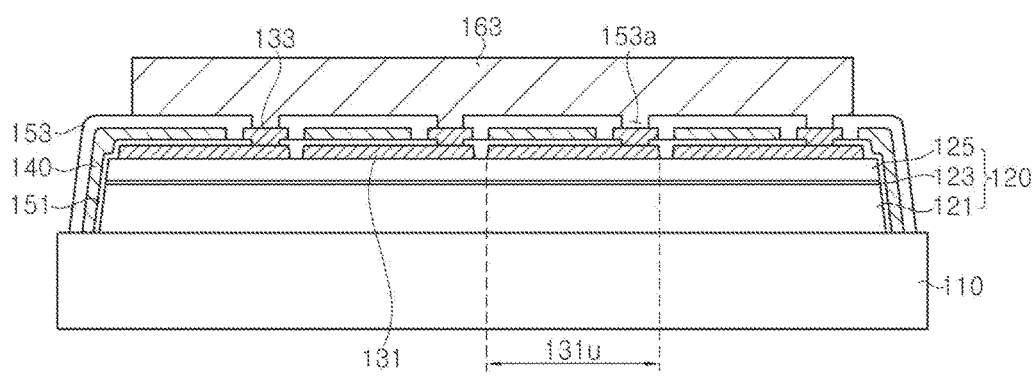
Figure 4:
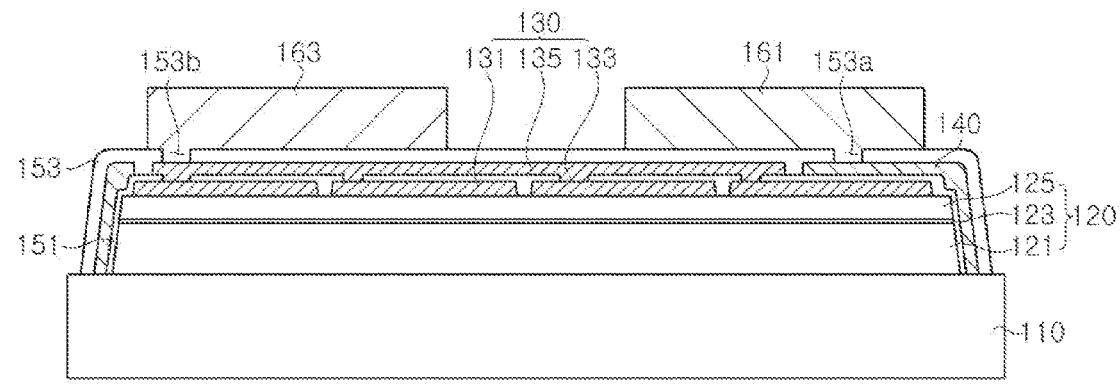

FIG. 1(*a*) through FIG. 4 are plan views and sectional views of a light emitting diode according to some embodiments. FIG. 2 to FIG. 4 are sectional views taken along lines A-A, B-B and C-C of FIG. 1(*a*), respectively. For convenience of description, FIG. 1 (*a*) shows an outer plane of the light emitting diode according to the exemplary embodiment and FIG. 1 (*b*) shows a plan view of the light emitting diode according to the exemplary embodiment, which includes arrangement of a second electrode 130. Reference numerals of components in the plan views will be described in more detail with reference to exemplary embodiments shown in FIG. 7 to FIG. 12.

Referring to FIG. 1(*a*) through FIG. 4, a light emitting diode according to some embodiments includes a light emitting structure 120, which includes a first conductive type semiconductor layer 121, an active layer 123 and a second conductive type semiconductor layer 125, a first electrode 140, and a second electrode 130. The light emitting diode can further include a growth substrate 110, a first insulation layer 151, a second insulation layer 153, a first electrode pad 161, and a second electrode pad 163.

As for the growth substrate 110, any substrate can be used so long as the substrate allows growth of the light emitting structure 120 thereon, and can include, for example, a sapphire substrate, a silicon carbide substrate, a silicon substrate, a gallium nitride substrate, an aluminum nitride substrate, and the like. In this exemplary embodiment, the growth substrate 110 can be a patterned sapphire substrate (PSS).

In the light emitting diode, the growth substrate 110 can be omitted. When the growth substrate 110 is used as a growth substrate for the light emitting structure, the growth substrate 110 can be removed from the light emitting structure 120 using any method well-known to a person having ordinary knowledge in the art (hereinafter, "those skilled in the art"). The growth substrate 110 can be separated or removed from the light emitting structure by a physical/chemical process, for example, laser lift-off, chemical lift-off, stress lift-off, polishing, and the like.

The light emitting structure 120 can include the first conductive type semiconductor layer 121, the active layer 123 disposed on the first conductive type semiconductor layer 121, and the second conductive type semiconductor layer 125 disposed on the active layer 123. Further, the light emitting diode includes a plurality of holes 127, which are formed through the second conductive type semiconductor layer 125 and the active layer 123 of the light emitting structure 120 such that the first conductive type semiconductor layer 121 is partially exposed therethrough.

The first conductive type semiconductor layer 121, the active layer 123 and the second conductive type semiconductor layer 125 can include a III-V-based compound semiconductor, for example, a nitride semiconductor such as (Al, Ga, In)N. The first conductive type semiconductor layer 121 can include an n-type impurity, for example, Si, and the second conductive type semiconductor layer 125 can include a p-type impurity, for example, Mg, or vice versa. The active layer 123 can include a multi-quantum well (MQW) structure.

The plurality of holes 127 can be formed by partially removing the active layer 123 and the second conductive type semiconductor layer 125 such that an upper surface of the first conductive type semiconductor layer 121 is partially exposed therethrough. The number and location of the plural holes 127 are not particularly limited. For example, the holes 127 can be regularly arranged at constant intervals, as shown in FIG. 1. Locations of unit electrodes 131$u$ can be determined depending upon the locations of the plurality of holes 127.

As described hereinafter, the first electrode 140 can form ohmic contact with the first conductive type semiconductor layer 121 through the holes 127. Thus, as the holes 127 are arranged at regular intervals in the light emitting structure 120, the light emitting diode generally allows uniform spreading of electric current throughout the light emitting structure 120. Here, it should be understood that the number and locations of holes 127 are illustrated by way of example and can be determined in various ways by taking into account current spreading efficiency or current spreading performance.

Further, since the first electrode 140 forms ohmic contact with the first conductive type semiconductor layer 121 through the holes 127, regions of the active layer 123 to be removed to form electrodes connected to the first conductive type semiconductor layer 121 are the same as the regions corresponding to the plurality of holes 127. With this structure, the light emitting diode can minimize a region for ohmic contact between the metal layer and the first conductive type semiconductor layer 121, and has a higher ratio of a light emitting area to an overall chip area than light emitting diodes in the related art.

The first electrode 140 and the second electrode 130 can be electrically connected to the first conductive type semiconductor layer 121 and the second conductive type semiconductor layer 125, respectively. For example, the second electrode 130 can include a contact layer 131 and a first connection layer 135, and can further include a second connection layer 133. On the other hand, the first electrode 140 and the second electrode 130 are insulated from each other. For example, the first electrode 140 and the second electrode 130 can be insulated from each other by the first insulation layer 151 and the second insulation layer 153.

The contact layer 131 is disposed on the second conductive type semiconductor layer 125 and can partially cover an upper surface of the second conductive type semiconductor layer 125 while forming ohmic contact therewith. In addition, the contact layer 131 can be divided into a plurality of unit electrodes 131$u$ separated from each other on the light emitting structure 120. Here, each of the unit electrodes 131$u$ includes an opening corresponding to at least one hole 127. Thus, at least one hole 127 can be exposed through the opening, and the openings of the unit electrodes 131$u$ can have a greater width and area than the holes 127.

The unit electrodes 131$u$ can be disposed on the light emitting structure 120 so as to have substantially the same area and/or shape, and can also be regularly arranged thereon. For example, as shown in FIG. 1($a$), the unit electrodes 131$u$ can be disposed in a lattice arrangement. With the structure wherein the plural unit electrodes 131$u$ forming ohmic contact with the second conductive type semiconductor layer 125 generally have the same area and/or shape, the light emitting diode enables uniform current spreading throughout the light emitting structure 120.

Referring again to FIG. 1($a$) through FIG. 4, the unit electrodes 131$u$ can be disposed based on the locations of the plurality of holes 127. For example, the opening of each of the unit electrodes 131$u$ can be placed at a central portion of each of the unit electrodes 131$u$, and thus each of the plural holes 127 can be placed at the central portion of each of the unit electrodes 131$u$.

In operation of the light emitting diode according to the exemplary embodiments, the first conductive type semiconductor layer 121 forms ohmic contact with the first electrode 140 through the plurality of holes 127 and the second conductive type semiconductor layer 125 forms ohmic contact with each of the unit electrodes 131$u$. Accordingly, electric current can be supplied to the first and second conductive type semiconductor layers 121 and 125 through the plurality of holes 127 and the unit electrodes 131$u$, and each of the holes 127 is placed at the central portion of the unit electrode 131$u$, whereby electric current can be evenly spread throughout the light emitting structure under the unit electrodes 131$u$. As such, with the structure wherein the unit electrodes 131$u$ and the holes 127 are evenly arranged throughout the light emitting structure, the light emitting diode allows electric current to be uniformly spread throughout the overall light emitting area of the light emitting structure. As a result, the light emitting diode according to the exemplary embodiment has improved current spreading efficiency or current spreading performance.

The contact layer 131 can include a reflective metal layer, without being limited thereto. For example, the contact layer 131 can include at least one of ITO, ZnO, IZO or Ni/Au. The contact layer 131 including such a transparent conductive oxide or a transparent metal can form ohmic contact with the second conductive type semiconductor layer 125. When the second electrode 130 include such a transparent conductive material, the second insulation layer 153 described below can be formed to exhibit reflectivity so as to act as a reflective layer.

In some embodiments, the contact layer 131 can include a reflective layer and a cover layer covering the reflective layer.

As described above, the contact layer 131 can form ohmic contact with the second conductive type semiconductor layer 125 while acting as a reflector reflecting light. Thus, the reflective layer can include a metal having high reflectivity and capable of forming ohmic contact with the second conductive type semiconductor layer 125. For example, the reflective layer can include at least one of Ni, Pt, Pd, Rh, W, Ti, Al, Ag or Au. Further, the reflective layer can be composed of a single layer or multiple layers.

The cover layer can prevent inter-diffusion between the reflective layer and other materials, and thus can prevent damage to the reflective layer due to diffusion of external materials into the reflective layer. Accordingly, the cover layer can be formed to cover a lower surface and a side surface of the reflective layer. The cover layer can be electrically connected together with the reflective layer to the second conductive type semiconductor layer 125 and thus can act as an electrode together with the reflective layer. The cover layer can include at least one of, for example, Au, Ni, Ti, or Cr, and can be composed of a single layer or multiple layers.

Referring again to the drawings, the light emitting diode can further include the first insulation layer 151. The first insulation layer 151 can partially cover the light emitting structure 120 and the contact layer 131. In addition, the first insulation layer 151 can cover side surfaces of the plurality of holes 127 while exposing bottom surfaces of the holes 127, and can further cover a side surface of the light emitting structure 120.

The first insulation layer 151 can include a first opening placed at a portion corresponding to the plurality of holes 127 and second openings partially exposing the contact layer 131. The first conductive type semiconductor layer 121 can be partially exposed through the first opening and the holes 127, and the contact layer 131 can be partially exposed through the second openings. Each of the unit electrodes 131u can include at least one second opening.

The first insulation layer 151 can include an insulation material, for example, $SiO_2$ or $SiN_x$. Further, the first insulation layer 151 can be composed of multiple layers, and can include a distributed Bragg reflector in which materials having different indexes of refraction are alternately stacked one above another.

The first electrode 140 can be disposed on the light emitting structure 120 and fill the plurality of holes 127 to form ohmic contact with the first conductive type semiconductor layer 121. The first electrode 140 can be formed to cover the entirety of the first insulation layer 151 excluding some regions thereof. In some implementations, the first electrode 140 can be formed to cover the side surface of the light emitting structure 120. As the first electrode 140 is formed to cover the side surface of the light emitting structure 120, the first electrode 140 reflects light emitted from the active layer 123 through the side surface of the light emitting structure, thereby improving luminous efficacy of the light emitting diode. The first electrode 140 is not placed in regions corresponding to the second openings of the first insulation layer 151, and in regions virtually connecting the second openings. For example, as shown in FIG. 1 and FIG. 4, the first electrode 140 cannot be formed in regions corresponding to the second openings and the regions connecting the second openings.

With the structure in which the first electrode 140 is formed to cover the entirety of the light emitting structure 120 excluding some regions, the light emitting diode can have further improved current spreading efficiency or current spreading performance. Further, since a portion of the light emitting structure not covered by the contact layer 131 can be covered by the first electrode 140, the light emitting diode can have further improved luminous efficacy through more effective reflection of light.

The first electrode 140 can form ohmic contact with the first conductive type semiconductor layer 121 while acting as a reflector reflecting light. The first electrode 140 can include at least one of Ni, Pt, Pd, Rh, W, Ti, Al, Cr, Ag or Au. For example, the first electrode 140 can include a highly reflective metal layer such as an Al layer. Here, the highly reflective metal layer can be formed on a bonding layer such as a Ti, Cr or Ni layer.

The first electrode 140 can be insulated from the contact layer 131 and the side surface of the light emitting structure 121. For example, the first insulation layer 151 can be disposed between the first electrode 140 and the contact layer 131 to be insulated therefrom.

The first connection layer 135 can electrically connect at least two second openings of the first insulation layer 151 to each other, whereby the first connection layer 135 can electrically connect at least two unit electrodes 131u to each other. Further, the light emitting diode can further include second connection layers 133 which fill the second openings of the first insulation layer 151. In this structure, the first connection layer 135 electrically connects the unit electrodes 131u to each other by electrically connecting the second connection layers 133 to each other.

The first connection layer 135 can be disposed on the first insulation layer 151 and can be separated from the first electrode 140. For example, the first connection layer 135 can be placed in a region on the first insulation layer 151, in which the first electrode 140 is not placed. For example, as shown in FIG. 1 to FIG. 4, the first connection layer 135 can be formed to cover a region disposed on a virtual line that connects the second openings of one unit electrode 131u and another unit electrode 131u adjacent thereto.

The first connection layer 135 can electrically connect at least two unit electrodes 131u to each other. In some implementations, the first connection layer 135 can electrically connect all of the unit electrodes 131u disposed on the light emitting structure 120. For example, as shown, the first connection layer 135 can sequentially connect four unit electrodes 131u arranged in a vertical direction.

Figure 5:
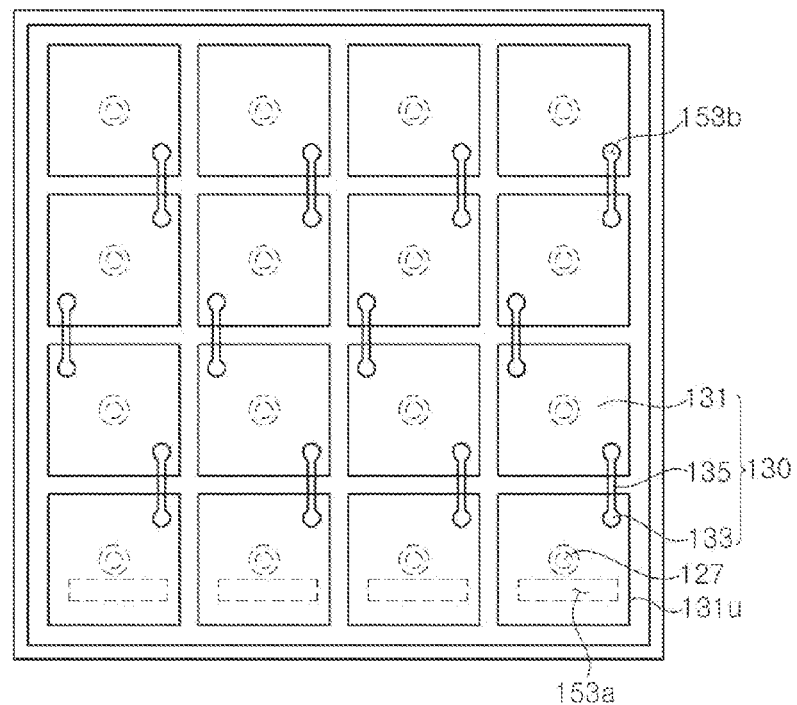
FIG. 5 is a plan view of an exemplary light emitting diode according to some embodiments.

It should be understood that the first connection layer 135 according to the exemplary embodiment is not limited thereto and can connect the unit electrodes 131u in various ways. For example, as shown in FIG. 5, the first connection layer 135 can sequentially connect four unit electrodes 131u arranged in the vertical direction and can be divided into a plurality of connection sections, which are disposed at different locations near corners of the unit electrodes 131u such that each of the connection sections electrically connects only two unit electrodes 131u arranged in the vertical direction and adjacent each other. In this embodiment, the first connection layer 135 can electrically connect at least two second openings of the first insulation layer 151 to each other, whereby at least two unit electrodes 131u are electrically connected to each other in parallel by the first connection layer 135. With this structure, current spreading efficiency (or performance) between the plural unit electrodes 131u can be improved, thereby improving current spreading efficiency (or performance) of the light emitting structure 120.

In the light emitting diode according to the exemplary embodiment, the contact layer 131 is divided into the plurality of unit electrodes 131u, thereby providing substantially uniform luminous efficacy and intensity throughout the light emitting area. In addition, the plurality of unit electrodes 131u are connected to each other in parallel via the first connection layer 135, thereby improving current spreading efficiency or current spreading performance throughout the light emitting area. Accordingly, the light emitting diode can provide substantially uniform intensity of light throughout the entirety of the chip while improving luminous efficacy.

The first connection layer 135 can be integrally formed with the second connection layer 133. In some implementations, the first connection layer 135 and the second connection layer 133 can include the same material as the first electrode 140. An upper surface of the first connection layer 135 can be substantially flush with an upper surface of the first electrode 140.

The second insulation layer 153 can cover the first electrode 140, the first connection layer 135, and the second connection layer 133. The second insulation layer 153 can include third openings 153a that partially expose the first electrode 140, and fourth openings 153b that partially expose the first connection layer 135 or the second connection layer 133 disposed on the plurality of holes 127.

Each of the third and fourth openings 153a and 153b can be formed in a singular or plural number. In some implementations, when the third opening 153a are placed near one side of the light emitting diode, the fourth opening 153b can be placed near the other side thereof.

The second insulation layer 153 can include an insulation material, for example, $SiO_2$ or $SiN_x$. Further, the second insulation layer 153 can be composed of multiple layers, and can include a distributed Bragg reflector in which materials having different indexes of refraction are alternately stacked one above another.

The light emitting diode can further include the first electrode pad 161 and the second electrode pad 163.

The first electrode pad 161 can be disposed on the second insulation layer 153 and is electrically connected to the first electrode 140 through the third opening 153a. The second electrode pad 163 can be disposed on the second insulation layer 153 and is electrically connected to the first connection layer 135 and/or the second connection layer 133 through the fourth opening 153b. With this structure, the first and second electrode pads 161 and 163 are electrically connected to the first and second conductive type semiconductor layers 121 and 125, respectively. Thus, the first and second electrode pads 161 and 163 can act as electrodes through which electric power is supplied from an external power source to the light emitting diode.

The first electrode pad 161 and the second electrode pad 163 are separated from each other and can include a bonding layer, such as a Ti, Cr or Ni layer, and a highly conductive layer such as an Al, Cu, Ag or Au layer. It should be understood that the present disclosure is not limited thereto and other implementations are also possible.

Figure 6:
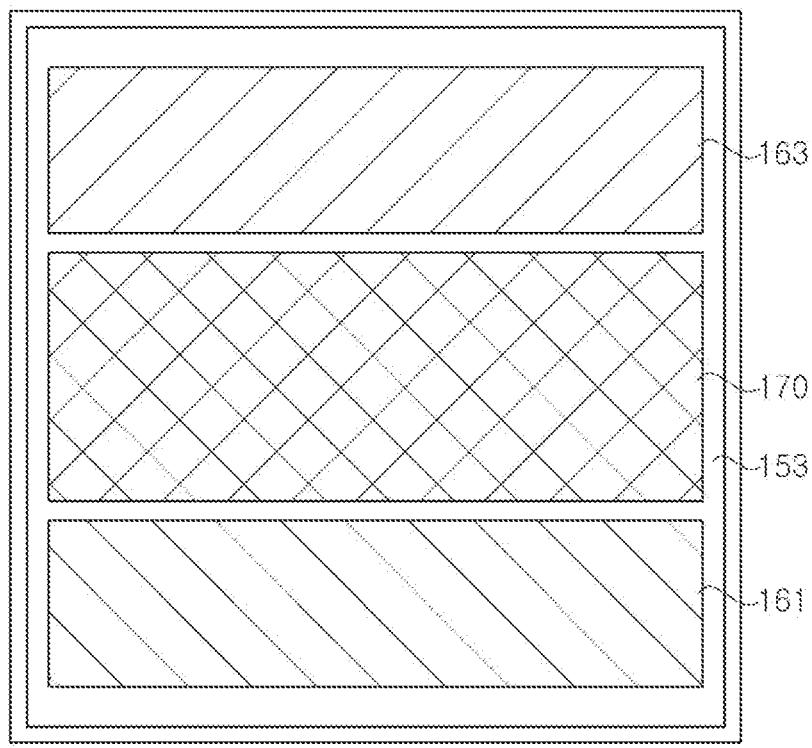
FIG. 6 is a plan view of an exemplary light emitting diode according to some embodiments.

FIG. 6 is a plan view of a light emitting diode according to some embodiments. The light emitting diode according to this exemplary embodiment can further include a heat dissipation pad 170.

Referring to FIG. 6, the light emitting diode further includes the heat dissipation pad 170 disposed on the second insulation layer 153. The light emitting diode according to the exemplary embodiment shown in FIG. 6 is generally similar to the light emitting diode shown in FIG. 1 to FIG. 4 excluding the heat dissipation pad 170.

The heat dissipation pad 170 can be formed on the second insulation layer 153 and can be electrically insulated from the light emitting structure 120. In some implementations, the heat dissipation pad 170 can be disposed between the first and second electrode pads 161 and 163, and can be electrically insulated therefrom. The heat dissipation pad 170 can include a material having high thermal conductivity. For example, the heat dissipation pad 170 can include Cu.

The light emitting diode includes the heat dissipation pad 170 to allow effective dissipation of heat generated upon light emission, while improving lifespan and reliability of a high output large flip-chip type light emitting diode. Further, the light emitting diode according to the exemplary embodiment can prevent deterioration in properties thereof due to heat generated upon light emission.

Furthermore, since the heat dissipation pad 170 is disposed on the second insulation layer 153 and electrically insulated from the light emitting structure 120, it is possible to prevent electrical problems (for example, short circuit) due to the heat dissipation pad 170.

FIG. 7(a) through FIG. 12(b) are plan views and sectional views illustrating a method for manufacturing a light emitting diode according to some embodiments.

The manufacturing method according to the exemplary embodiment shown in FIG. 7(a) through FIG. 12(b) can provide the light emitting diode described with reference to FIG. 1 to FIG. 4. Thus, detailed descriptions of the same components as those of the light emitting diode according to the exemplary embodiment described with reference to FIG. 1 to FIG. 4 will be omitted. Thus, it should be understood that the present disclosure is not limited to the following exemplary embodiments.

FIG. 7(a) through FIG. 12(b) show plan views and sectional views. Each of the sectional views is taken along line D-D or E-E in the corresponding plan view.

Figure 7A:
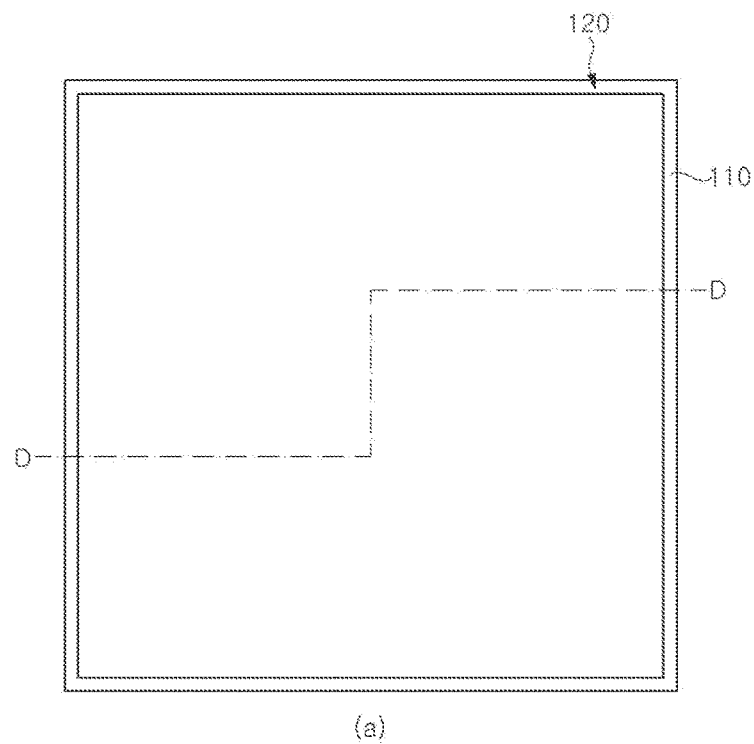
FIG. 7(a) through FIG. 12(b) are plan views and sectional views illustrating an exemplary method for manufacturing a light emitting diode according to some embodiments.
Figure 7B:
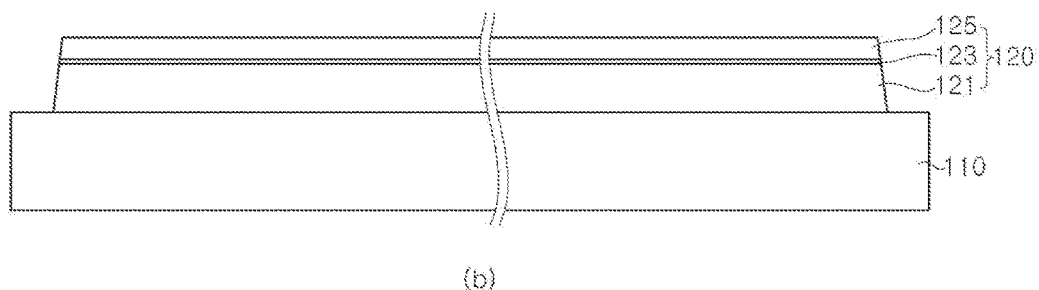

First, referring to FIGS. 7(a) and 7(b), a light emitting structure 120 including a first conductive type semiconductor layer 121, an active layer 123 and a second conductive type semiconductor layer 125 is formed on a growth substrate 110.

The growth substrate 110 can be or include a substrate which allows growth of the light emitting structure 120 thereon, and can include, for example, a patterned sapphire substrate (PSS).

The first conductive type semiconductor layer 121, the active layer 123, and the second conductive type semiconductor layer 125 are sequentially grown on the growth substrate 110. The light emitting structure 120 can include a nitride semiconductor and can be formed by a method for growing a nitride semiconductor layer well-known to those skilled in the art, such as MOCVD, HVPE, or MBE, and the like.

Figure 8A:
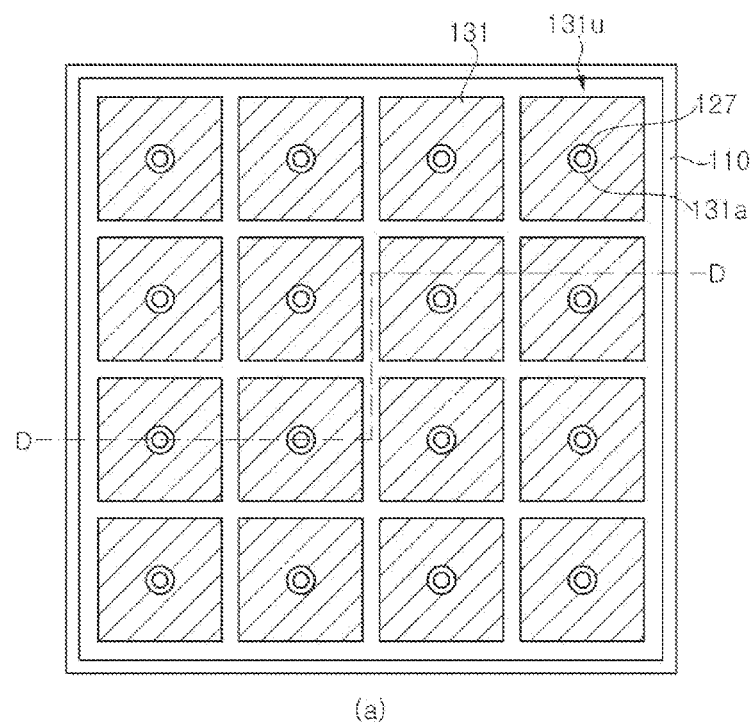
Figure 8B:
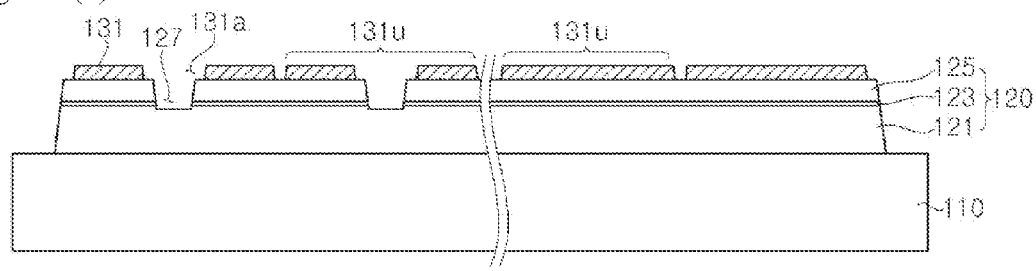

Next, referring to FIGS. 8(a) and (8(b)), a plurality of holes 127 and a plurality of unit electrodes 131u are formed by patterning the light emitting structure 120. The plurality of holes 127 are formed to expose the first conductive type semiconductor layer 121 and the plurality of unit electrodes 131u are separated from each other on the second conductive type semiconductor layer 125 while forming ohmic contact with the second conductive type semiconductor layer 125. Formation sequence of the holes 127 and the unit electrodes 131u can be freely determined as needed.

Patterning of the light emitting structure 120 can be performed by etching and photolithography. As shown, the plurality of holes 127 can be regularly formed, without being limited thereto.

The plurality of unit electrodes 131u can be formed by deposition and etching of a metallic material or a transparent conductive oxide. Alternatively, the plurality of unit electrodes 131u can be formed by deposition and lift-off of the metallic material or the transparent conductive oxide. Each of the unit electrodes 131u can be formed to surround one hole 127 and can include an opening 131a that exposes the hole 127.

The plural unit electrodes 131u can be formed to have the holes 127 placed at the center thereof and can be regularly arranged. For example, as shown, the plural unit electrodes 131u can be disposed in a lattice arrangement.

Figure 9A:
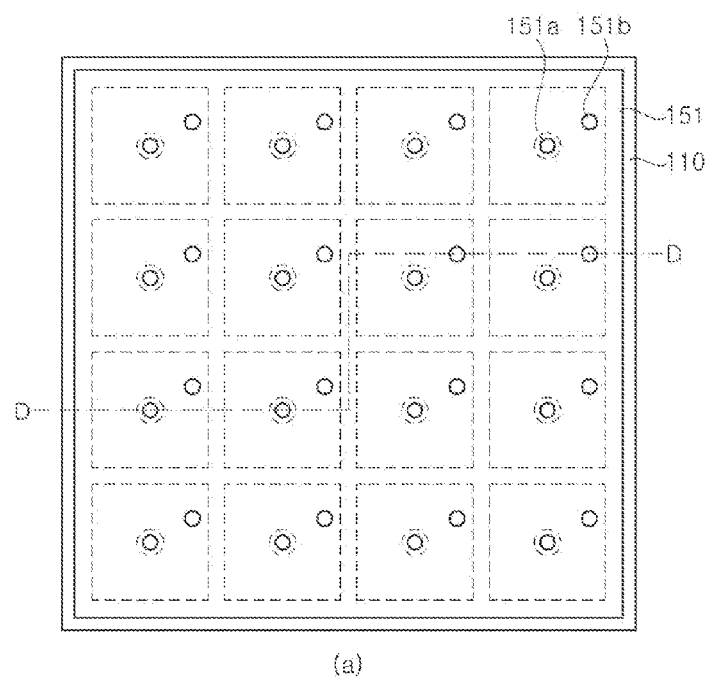
Figure 9B:
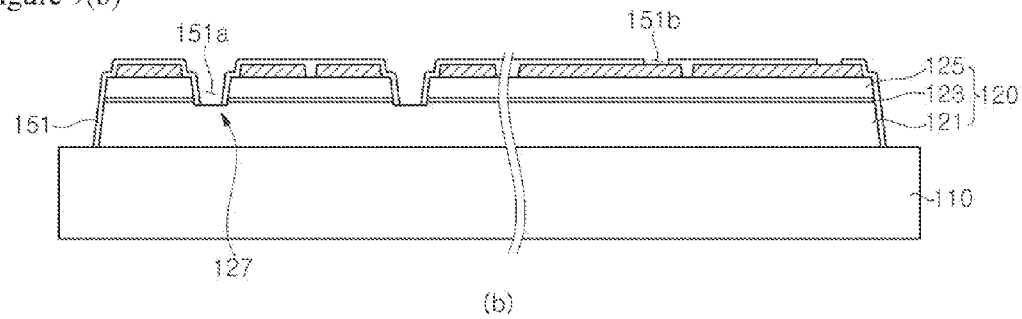

Next, referring to FIGS. 9(a) and 9(b), a first insulation layer 151 can be formed to cover the light emitting structure 120 and a contact layer 131. In addition, the first insulation layer 151 can also cover side surfaces of the plurality of holes 127.

The first insulation layer 151 can include a first opening 151a that exposes bottom surfaces of the plurality of holes 127, and second openings 151b that partially expose the contact layer 131. The first insulation layer 151 can be formed by deposition and patterning of an insulation material such as $SiO_2$.

Figure 9C:
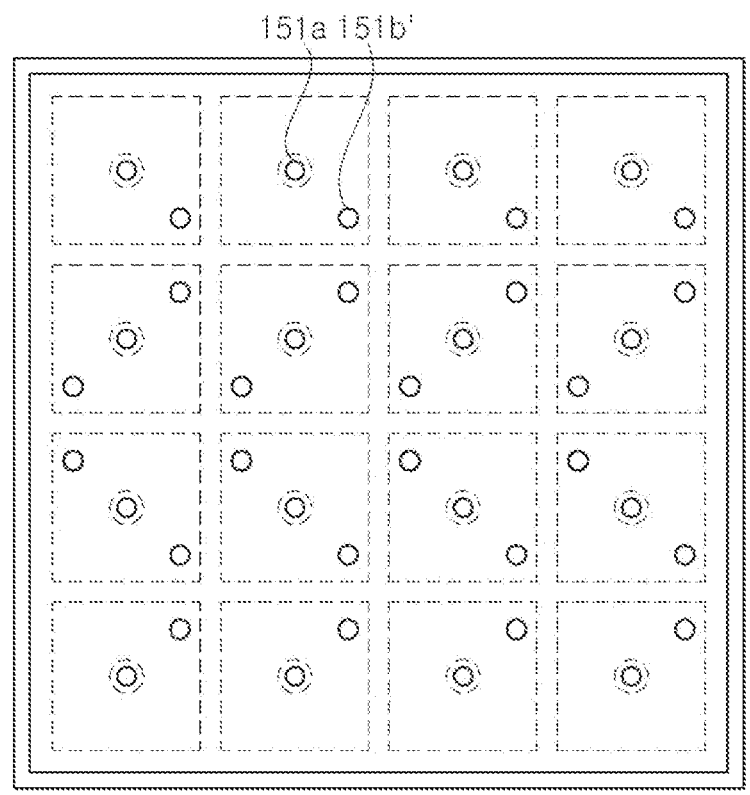

Depending upon locations of the second openings 151b of the first insulation layer 151, a location of a first connection layer 135 can be determined in a subsequent process. Accordingly, the second openings 151b can be formed at locations depending upon a desired location of the first connection layer 135 to be formed. For example, second openings 151b' can be formed as shown in FIG. 9(c). When the locations of the second openings 151b' are determined as shown in FIG. 9(c), the light emitting diode has the structure as shown in FIG. 5.

Figure 10A:
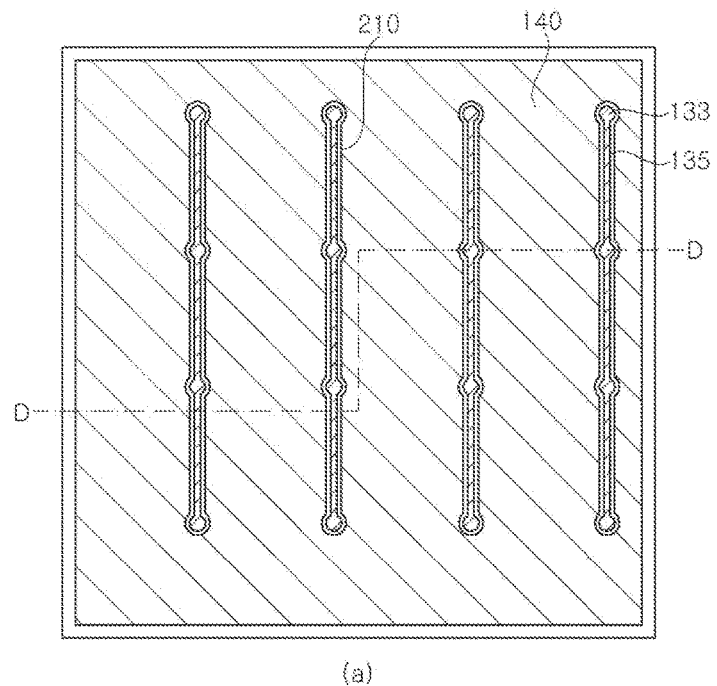
Figure 10B:
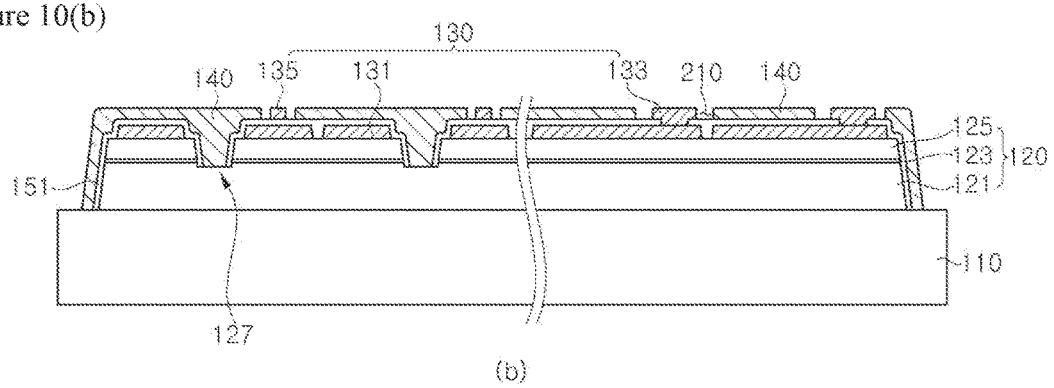

Referring to FIGS. 10(a) and 10(b), a first electrode 140 and the first connection layer 135 are formed on the light emitting structure 120 and the first insulation layer 151. Furthermore, a second connection layer 133 can also be formed to fill the second openings 151b.

The first electrode 140 can be formed by deposition and patterning of a metallic material, and can be formed to cover the entirety of the first insulation layer 151 excluding a region in which the first connection layer 135 and the second connection layer 133 are formed. Further, the first electrode 140 can fill the first openings 151a to form ohmic contact with the first conductive type semiconductor layer 121 through the plurality of holes 127.

The second connection layer 133 can be formed to fill the second openings 151b by deposition and thus is electrically connected to the contact layer 131. The first connection layer 135 can be formed to electrically connect at least two unit electrodes 131u to each other. For example, the first connection layer 135 can electrically connect one second connection layer 133 to another second connection layer 133 adjacent thereto. The first connection layer 135 can be formed on the first insulation layer 151. The first electrode 140, the first connection layer 135 and the second connection layer 133 can be separated from each other and thus are electrically insulated from one another.

Further, the first electrode 140, the first connection layer 135 and the second connection layer 133 can be simultaneously formed by the same deposition process. For example, the first electrode 140, the first connection layer 135 and the second connection layer 133 can be formed by depositing a metallic material to cover the light emitting structure 120 and the first insulation layer 151, followed by patterning or lift-off the metallic material so as to form a separation region 210. Thus, the first electrode 140, the first connection layer 135 and the second connection layer 133 can include the same material. Further, upper surfaces of the first electrode 140, the first connection layer 135 and the second connection layer 133 can be flush with each other.

As such, the first electrode 140, the first connection layer 135 and the second connection layer 133 are simultaneously formed by the same process, thereby simplifying the process of manufacturing the light emitting diode. It should be understood that the present disclosure is not limited thereto and other implementations are also possible.

Although the first connection layer 135 and the second connection layer 133 are formed in the form of a plurality of stripes in this exemplary embodiment, it should be understood that the present disclosure is not limited thereto and other implementations are also possible. Positioning and the number of first connection layers 135 connecting the plurality of unit electrodes 131u can be changed in various ways.

Figure 11A:
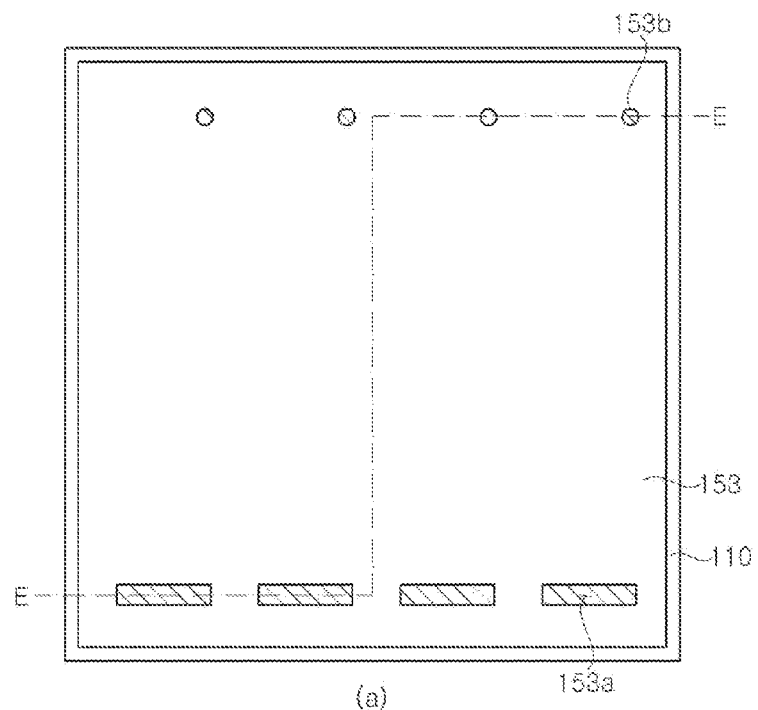
Figure 11B:
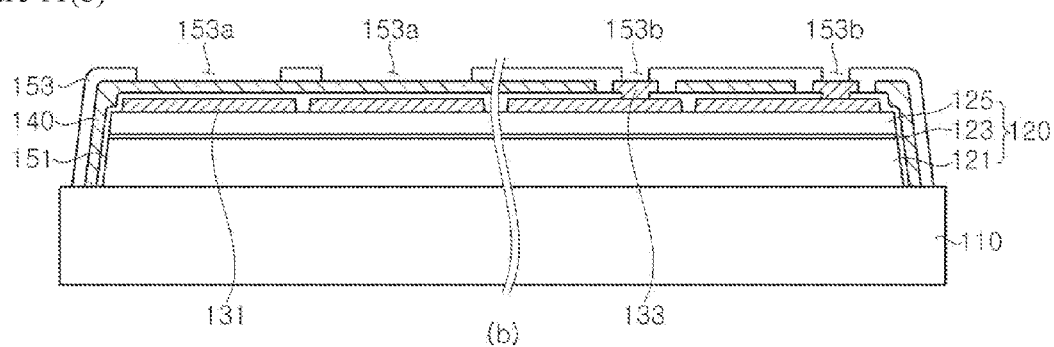
Figure 12A:
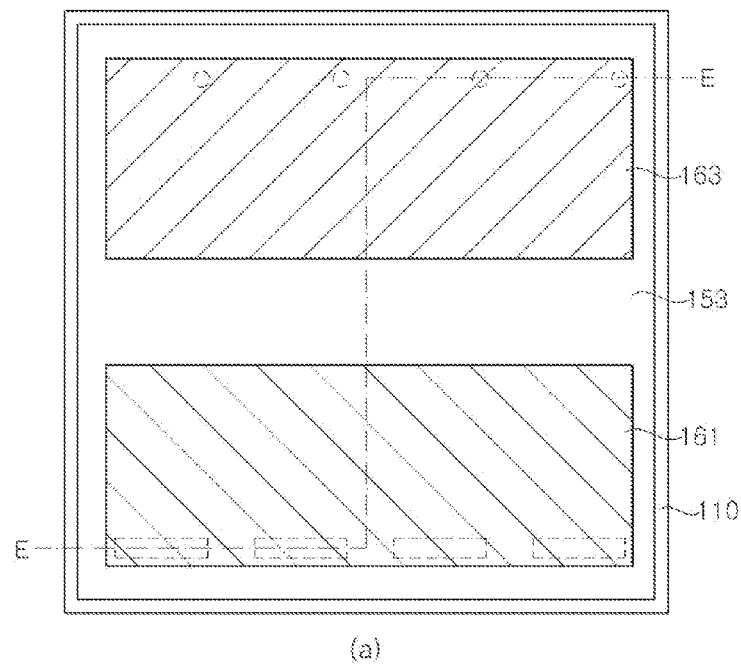
Figure 12B:
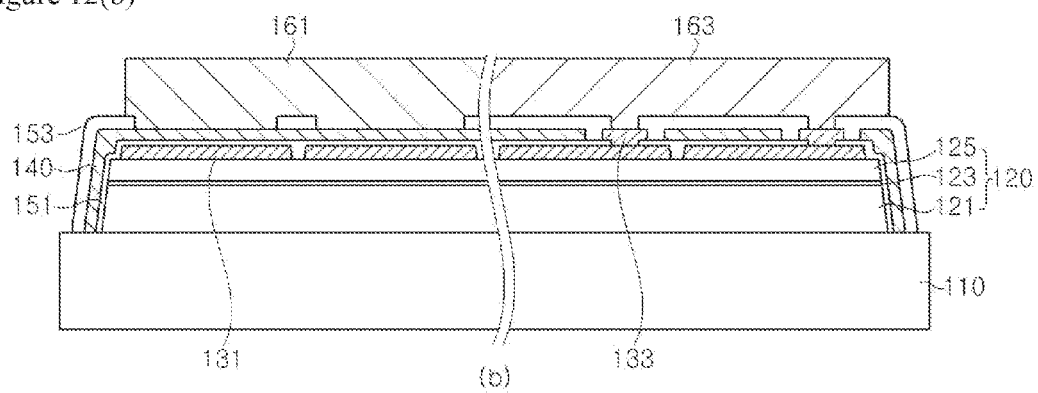

Next, referring to FIGS. 11(a) and 11(b), a second insulation layer 153 can be formed to cover the first electrode 140, the first connection layer 135 and the second connection layer 133.

The second insulation layer 153 can include at least one third opening 153a which partially exposes the first electrode 140, and at least one fourth opening 153b which partially exposes the second connection layer 133 and/or the first connection layer 135. The second insulation layer 153 can be formed by deposition and patterning of an insulation material such as $SiO_2$.

In some implementations, the second insulation layer 153 can be formed to fill a separation region 210 between the first electrode 140 and the first connection layer 135 or the second connection layer 133, thereby enhancing electrical insulation between the first electrode 140 and the first connection layer 135 or the second connection layer 133.

The third opening 153a can be formed near one side of the light emitting diode and the fourth opening 153b can be formed near the other side of the light emitting diode. Thus, the third and fourth openings 153a and 153b can be formed near opposite sides of the light emitting diode, respectively, as shown in the drawings.

Then, a first electrode pad 161 and a second electrode pad 163 can be further formed on the second insulation layer 153. As a result, a light emitting diode as shown in FIG. 10(a) through FIG. 12(b) can be provided.

The first electrode pad 161 can be formed on the third openings 153a to fill the third openings 153a, and thus is electrically connected to the first electrode 140. Similarly, the second electrode pad 163 can be formed on the fourth openings 153b to fill the fourth openings 153b, and thus is electrically connected to the contact layer 131. The first electrode pad 161 and the second electrode pad 163 can be used as pads for connection of bumps for mounting the light emitting diode on a sub-mount, a package, or a printed circuit board, or pads for surface mount technology (SMT).

The first and second electrode pads 161 and 163 can be formed simultaneously by the same process, for example, a photolithography and etching process or a lift-off process.

In addition, the method for manufacturing a light emitting diode can further include separating the growth substrate 110 from the light emitting structure 120. The growth substrate 110 can be separated or removed by a physical and/or chemical method.

The method for manufacturing a light emitting diode can further include forming a heat dissipation pad 170 on the second insulation layer 153. The heat dissipation pad 170 can be formed together with the first and second electrode pads 161, 163 at the same time. The method for manufacturing a light emitting diode further including forming the heat dissipation pad 170 provides the light emitting diode as shown in FIG. 6.

Figure 13:
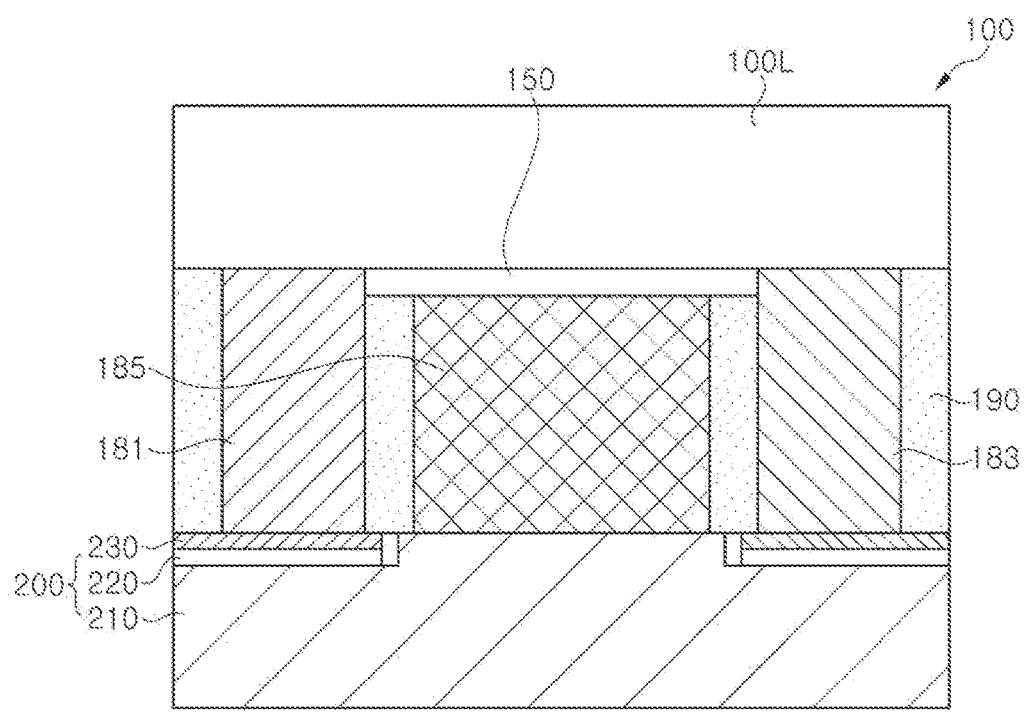
FIG. 13 is a sectional view of an exemplary light emitting device according to some embodiments.
Figure 15:
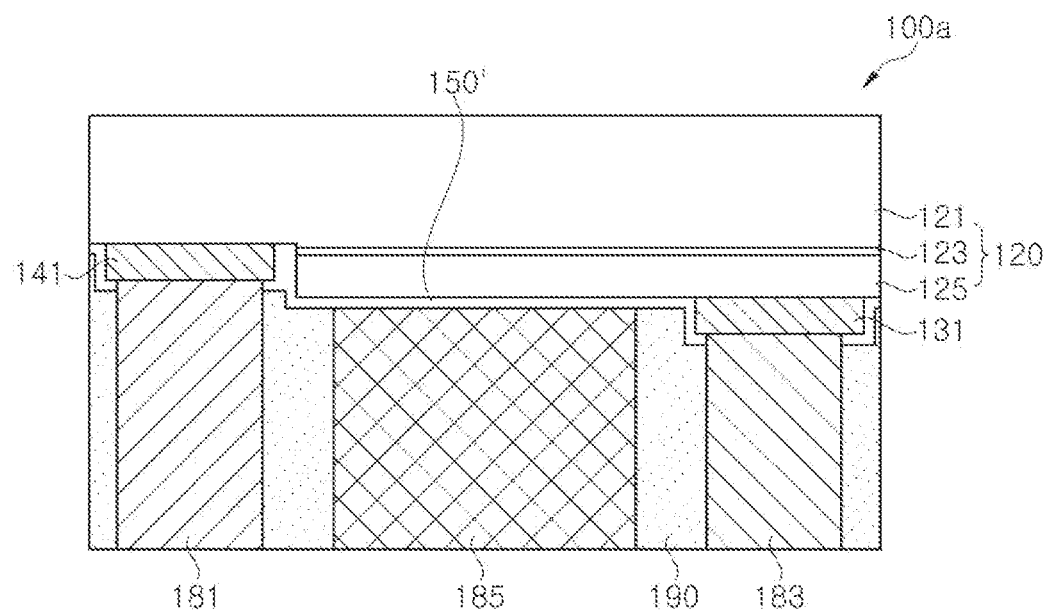
FIG. 15 is a sectional view of an exemplary light emitting diode according to some embodiments.

FIG. 13 is a sectional view of a light emitting device according to some embodiments. In addition, FIG. 15 is a sectional view of a light emitting diode according to some embodiments, and FIG. 16 to FIG. 18 are plan views and sectional views of a light emitting diode according to some embodiments.

Referring to FIG. 13, the light emitting device includes a light emitting diode 100 and a substrate 200. The light emitting diode 100 can be disposed on the substrate 200.

The light emitting diode 100 includes a light emitting section 100L, a first bump 181, a second bump 183, and a heat dissipation bump 185. The light emitting diode 100 can further include an insulation layer 150 and an insulation material unit 190. On the other hand, the substrate 200 can include a base 210 and a conductive pattern 230, and can further include an insulation pattern 200 placed in at least some region between the base 210 and the conductive pattern 230.

First, the light emitting diode 100 will be described hereinafter.

The light emitting section 100L can include a light emitting structure which includes a first conductive type semiconductor layer, a second conductive type semiconductor layer, and an active layer disposed between the first conductive type semiconductor layer and the second conductive type semiconductor layer. As for the structure of the light emitting section 100L, any structure allowing a first bump 181 and a second bump 183 to be electrically connected to a lower side thereof can be used without limitation. Details of the light emitting diode 100 and the light emitting section 100L will be described hereinafter with reference to FIG. 15 to FIG. 18.

The first bump 181 and the second bump 183 can be disposed under the light emitting structure 120. The first bump 181 and the second bump 183 are separated from each other to be insulated from each other, and can be electrically connected to different polarities. For example, the first bump 181 can be electrically connected to an N-type semiconductor layer of the light emitting section 100L, and the second bump 183 can be electrically connected to a P-type semiconductor layer of the light emitting section 100L.

The first bump 181 can be placed near one side of a lower surface of the light emitting section 100L and the second bump 183 can be placed near the other side of the lower surface of the light emitting section 100L. In this structure, a certain space can be defined between the first bump 181 and the second bump 183, as shown in the drawings. The heat dissipation bump 185 can be disposed in this space. Accordingly, the heat dissipation bump 185 can be disposed between the first bump 181 and the second bump 183. However, it should be understood that the present disclosure is not limited thereto and other implementations are also possible. Arrangement of the first and second bumps 181 and 183 and the heat dissipation bump 185 can be changed in various ways as needed.

The first bump 181 and the second bump 183 can include a conductive material, such as metal, and particularly, a solder. The solder can be or include a typical solder known to those skilled in the art and can include Sn, Cu, Ag, Bi, In, Zn, Sb, or Pb, and the like. For example, the solder can be or include a Sn—Ag—Cu-based solder.

In addition, each of the first bump 181 and the second bump 183 can be composed of a single layer or multiple layers. When each of the first bump 181 and the second bump 183 is composed of a single layer, the first bump 181 and the second bump 183 can be composed of or include solders. Alternatively, when each of the first bump 181 and the second bump 183 is composed of multiple layers, a solder layer can be placed at the lowermost layer. Here, the solder layer can contact the conductive pattern 230 of the substrate 200 to be bonded thereto.

The heat dissipation bump 185 can be disposed under the light emitting section 100L and can be electrically connected to the light emitting section 100L. The heat dissipation bump 185 can serve to dissipate heat from the light emitting section 100L to the outside of the light emitting section 100L.

The heat dissipation bump 185 can include a material having a relatively high thermal conductivity. In some implementations, the thermal conductivity of the heat dissipation bump 185 can be higher than those of the first and second bumps 181 and 183. The heat dissipation bump 185 can include a metal and can also include solders. The solder can be or include a typical solder known to those skilled in the art and include Sn, Cu, Ag, Bi, In, Zn, Sb, or Pb, and the like. For example, the solder can be or include a Sn—Ag—Cu-based solder, without being limited thereto. For example, the solder of the heat dissipation bump 185 can have higher thermal conductivity than the first bump 181 and the second bump 183.

In addition, the heat dissipation bump 185 can be composed of a single layer or multiple layers. When the heat dissipation bump 185 is composed of multiple layers, a solder layer can be disposed at the lowermost side. The solder layer can contact the base 210 of the substrate 200 to be bonded thereto.

Since the heat dissipation bump 185 is physically connected to the light emitting section 100L, heat dissipation efficiency of the light emitting diode can increase with increasing area of the heat dissipation bump 185. Thus, a contact area between the heat dissipation bump 185 and the light emitting section 100L can be greater than the contact area between the first bump 181 and/or the second bump 183 and the light emitting section 100L. Further, since the thermal conductivity of the heat dissipation bump 185 can be higher than those of the first and second bumps 181 and 183, the light emitting device can have further improved heat dissipation efficiency. In addition, the heat dissipation bump 185 can be disposed between the first bump 181 and the second bump 183 to be disposed under a central portion of the light emitting section 100L. However, it should be understood that the present disclosure is not limited thereto and other implementations are also possible. Arrangement of the heat dissipation bump 185, the first bump 181 and the second bump 183 can be changed in various ways as needed.

The light emitting diode 100 can further include the insulation layer 150, which insulates the light emitting section 100L from the heat dissipation bump 185. The insulation layer 150 can include a silicon-based insulation material such as $SiO_x$, or $SiN_x$, and the like, and can also include another insulation material having good thermal conductivity. Further, the insulation layer can include a distributed Bragg reflector in which materials having different indexes of refraction are alternately stacked one above another.

As such, since the heat dissipation bump 185 is insulated from the light emitting section 100L by the insulation layer 150, it is possible to minimize electrical problems such as short circuit by the heat dissipation bump 185 during operation of the light emitting device. At the same time, the heat dissipation bump 185 is physically connected to the light emitting section 100L with the insulation layer 150 interposed therebetween, so that heat generated in the light emitting section 100L can be effectively transferred to the heat dissipation bump 185, thereby improving heat dissipation efficiency of the light emitting diode 100.

As described above, according to the exemplary embodiment, the first bump 181, the second bump 183 and the heat dissipation bump 185 include the solders. Accordingly, in a process of mounting the light emitting diode 100 on the substrate 200, the light emitting diode 100 can be bonded to the substrate 200 simply by placing the light emitting diode 100 in a certain region of the substrate 200, followed by heating to a melting point of the solder and cooling.

Specifically, the method for manufacturing the light emitting device according to some embodiments will be described with reference to FIG. 14.

Figure 14:
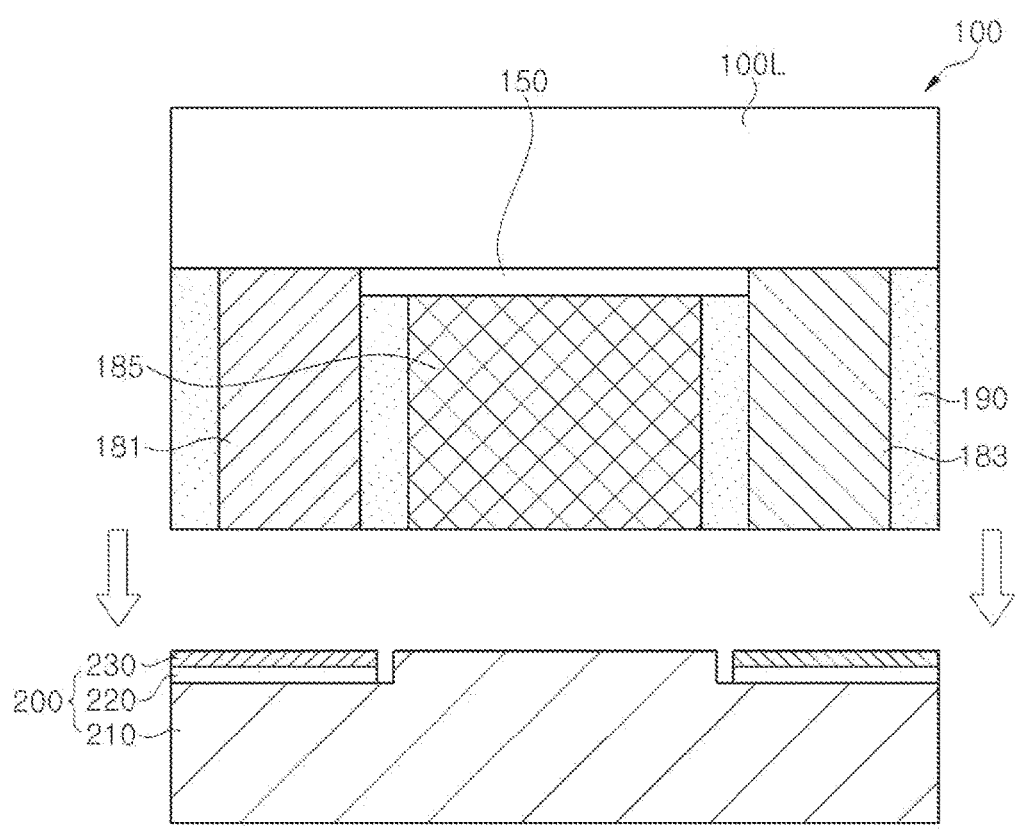
FIG. 14 is a sectional view illustrating an exemplary method for manufacturing a light emitting diode according to some embodiments.

Referring to FIG. 14, the light emitting diode 100 is disposed on the substrate 200 which includes the base 210 and the conductive pattern 230. The light emitting diode 100 can be placed at a location corresponding to a protrusion of the base 210. The protrusion of the base 210 can serve to indicate a mounting region of the light emitting diode 100. Thus, a process of mounting the light emitting diode 100 can be easily performed.

Then, as the temperature is increased to the melting point of the solder and is then decreased, the solders included in the first bump 181, the second bump 183 and heat dissipation bump 185 are dissolved and then cooled to bond the light emitting diode 100 to the substrate 200. For example, when the insulation material unit 190 is formed, the first bump 181, the second bump 183 and the heat dissipation bump 185 are prevented from flowing to a side surface or from being deformed, thereby improving process reliability.

As such, according to the exemplary embodiment, a separate component for bonding the light emitting diode 100 to the substrate 200 can be omitted. For example, there is no need for additional provision of a solder or a bonding agent between the light emitting diode 100 and the substrate 200 for bonding. Accordingly, it is possible to minimize electrical problems such as short circuit upon the soldering process, and the process of mounting the light emitting diode 100 on the substrate 200 can be very conveniently performed. In addition, the manufacturing method according to the exemplary embodiment can prevent failure caused by the bonding process such as soldering, thereby improving reliability of the light emitting device.

Referring again to FIG. 13, the light emitting diode 100 can further include an insulation material unit 190 surrounding side surfaces of the first bump 181, the second bump 183 and the heat dissipation bump 185.

The insulation material unit 190 exhibits electrical insulation properties and covers the side surface of the first bump 181, the second bump 183 and the heat dissipation bump 185 such that the first bump 181, the second bump 183 and the heat dissipation bump 185 can be effectively insulated from one another. Further, the insulation material unit 190 can also serve to support the first bump 181, the second bump 183 and the heat dissipation bump 185. Accordingly, it is possible to prevent the solders in the first bump 181, the second bump 183 and the heat dissipation bump 185 from being fused and bonded to each other in the process of mounting the light emitting diode 100 on the substrate 200.

A lower surface of the insulation material unit 190 can be generally flush with lower surfaces of the first bump 181, the second bump 183 and the heat dissipation bump 185. With this structure, the light emitting diode 100 can be more stably mounted on the substrate 200.

The insulation material unit 190 can include a resin. The resin can include Si or other polymer materials. Further, the insulation material unit 190 can exhibit optical reflectivity, and when the insulation material unit 190 includes a resin, the resin can include a resin, such as Si, which can reflect light. Alternatively, the resin can include light reflecting and scattering particles such as $TiO_2$ particles. As the insulation material unit 190 exhibits light reflectivity, light emitted from the light emitting section 100L is reflected upwards, thereby improving luminous efficacy of the light emitting device.

In addition, the insulation material unit 190 can further cover a side surface of the light emitting section 100L, whereby a light emitting angle of the light emitting diode 100 can be changed. For example, when the insulation material unit 190 further covers the side surface of the light emitting section 100L, some of light emitted through the side surface of the light emitting diode 100 can be reflected upwards. Thus, when the insulation material unit 190 is formed on the side surface of the light emitting section 100L, the ratio of light traveling to an upper portion of the light emitting diode 100 is increased. In this way, the light emitting angle of the light emitting diode 100 can be adjusted by regulating a region in which the insulation material unit 190 is placed.

The substrate 200 includes the base 210 and the conductive pattern 230, and can further include an insulation pattern 220.

The base 210 can act as a supporter of the substrate 200, and particularly include a material having good thermal conductivity. For example, the base 210 can include a metallic material having good thermal conductivity, such as Ag, Cu, Au, Al, or Mo, and the like. In addition, the base 210 can be composed of a single layer or multiple layers. Alternatively, the base 210 can include a ceramic material or polymer material having good thermal conductivity.

Further, the base 210 can directly contact the heat dissipation bump 185. In addition, the base 210 can include a protrusion, which contacts the heat dissipation bump 185 of the light emitting diode 100. An upper surface of the protrusion can be generally flush with an upper surface of the conductive pattern 230. Accordingly, when the light emitting diode 100 is mounted on the substrate 200, stable contact between the base 210 and the heat dissipation bump 185 can be secured.

With the structure wherein the heat dissipation bump 185 directly contacts the base 210 including a material having good thermal conductivity, the light emitting device can effectively transfer heat from the light emitting diode 100 to the base 210 upon operation of the light emitting diode. Accordingly, the light emitting device has improved heat dissipation efficiency.

According to the exemplary embodiment, the heat dissipation bump 185 physically connected to the light emitting section 100L is physically connected to the base 210 of the substrate 200, thereby enabling effective dissipation of heat upon light emission. Thus, it is possible to solve a problem of deterioration in thermal conductivity between the base of the substrate and the light emitting diode in the related art.

The conductive pattern 230 can be disposed on the base 210 while being insulated from the base 210. The conductive pattern 230 can be electrically connected to the first and second bumps 181 and 183. Thus, the conductive pattern 230 can include a first conductive pattern electrically connected to the first bump 181 and a second conductive pattern electrically connected to the second bump 183. Here, the first and second conductive patterns can be insulated from each other. As shown in the drawings, the first bump 181 and the second bump 183 can be disposed on the conductive pattern 230 and electrically connected to each other.

When the base 210 includes a material having electrical conductivity such as a metal, an insulation pattern 220 can be disposed between the base 210 and the conductive pattern 230 to insulate the base 210 from the conductive pattern 230. In addition, when the base 210 includes the protrusion, the conductive pattern 230 can be separated from the protrusion to be insulated therefrom. Further, an insulation material (not shown) can be interposed between the protrusion of the base 210 and the conductive pattern 230.

Alternatively, when the base 210 includes a ceramic material or a polymer material to exhibit electrical insulation properties, the insulation pattern 220 can be omitted.

However, it should be understood that the present disclosure is not limited thereto and other implementations are also possible. The conductive pattern 230 can be formed in plural numbers. The conductive pattern 230 can have various shapes depending upon the number and shapes of bumps of the light emitting diode 100. The conductive pattern 230 can act as an electrical circuit or a lead of the light emitting device.

On the other hand, the conductive pattern 230 can be placed at a location corresponding to the first and second bumps 181 and 183, and the protrusion of the base 210 can be placed at a location corresponding to the heat dissipation bump 185. Furthermore, an upper surface of the conductive pattern 230 can be generally flush with an upper surface of the protrusion. With this structure, the light emitting diode 100 can be stably mounted on an upper surface of the substrate 200. The conductive pattern 230 can include, for example, a metal.

According to some embodiments, the substrate 200 has a structure wherein the insulation pattern 220 and the conductive pattern 230 are formed on the base 210. Accordingly, a typical process of patterning an insulation layer between bases can be omitted, thereby reducing manufacturing costs of the light emitting device. In addition, the base 210 includes the protrusion, which directly contacts the heat dissipation bump 185 of the light emitting diode 100, whereby a contact area between the base 210 and the light emitting diode 100 increases, thereby significantly improving heat dissipation efficiency.

On the other hand, although a single light emitting diode 100 is mounted on the substrate 200 in this exemplary embodiment, the present disclosure is not limited thereto and other implementations are also possible. The light emitting device according to exemplary embodiments can include a plurality of light emitting diodes 100 mounted on the substrate 200. The plurality of light emitting diodes 100 can be electrically connected to each other in series, in parallel, or in reverse parallel. Electrical connection between the plurality of light emitting diodes 100 can be achieved by the conductive pattern 230. Here, the conductive pattern 230 can act as an electrical circuit.

As described above, the light emitting device according to the exemplary embodiments of the disclosure can include various forms of light emitting diodes. First, FIG. 15 is a sectional view of a light emitting diode according to some embodiments. In the exemplary embodiment shown in FIG. 15, detailed descriptions of components having the same reference numerals as those of the embodiment shown in FIG. 13 will be omitted.

Referring to FIG. 15, the light emitting diode 100a according to this exemplary embodiment can be or include a flip-chip type light emitting diode. The light emitting diode 100a includes a light emitting structure 120, a first bump 181, a second bump 183 and a heat dissipation bump 185, and can further include a first electrode pad 141, a second electrode pad 131, and an insulation layer 150'.

The light emitting structure 120 can include a first conductive type semiconductor layer 121, a second conductive type semiconductor layer 125, and an active layer 123 disposed between the first conductive type semiconductor layer 121 and the second conductive type semiconductor layer 125. The light emitting structure 120 can include mesas including the second conductive type semiconductor layer 125 and the active layer 123, and the first conductive type semiconductor layer 121 can be partially exposed in a region in which the mesas are not formed.

The first electrode pad 141 can be disposed on an exposed region of the first conductive type semiconductor layer 121 between the first bump 181 and the first conductive type semiconductor layer 121. Similarly, the second electrode pad 143 is disposed on the second conductive type semiconductor layer 125 between the second bump 183 and the second conductive type semiconductor layer 125. The first electrode pad 141 and the second electrode pad 143 can form ohmic contact with the first conductive type semiconductor layer 121 and the second conductive type semiconductor layer 125, respectively.

In addition, the light emitting diode 100a can further include an insulation layer 150' disposed between the light emitting structure 120 and the heat dissipation bump 185. Further, the insulation layer 150' can cover a lower surface of the light emitting structure 120 and side surfaces of the first electrode pad 141 and the second electrode pad 143 to protect the light emitting structure 120 from the outside. The insulation layer 150' can include a similar material to that of the insulation layer 150 according to the exemplary embodiment of FIG. 13.

On the other hand, although FIG. 15 shows that the growth substrate is separated from the light emitting diode 100a, the light emitting diode 100a can further include a growth substrate disposed on the first conductive type semiconductor layer 121. Here, as for the growth substrate, any substrate can be used without limitation so long as the substrate allows growth of the light emitting structure 120 thereon. For example, the growth substrate can include a sapphire substrate, a silicon carbide substrate, a silicon substrate, a gallium nitride substrate, or an aluminum nitride substrate, and the like.

As shown in FIG. 15, the first bump 181, the second bump 183 and the heat dissipation bump 185 are formed under the light emitting structure 120 of the flip-chip type light emitting diode 100a, thereby providing a light emitting diode having improved heat dissipation efficiency without changing the structure of a typical flip-chip type light emitting diode. Further, the light emitting diode 100a of FIG. 15 can be mounted on the substrate 200, thereby providing a light emitting diode having improved heat dissipation efficiency.

Figure 16A:
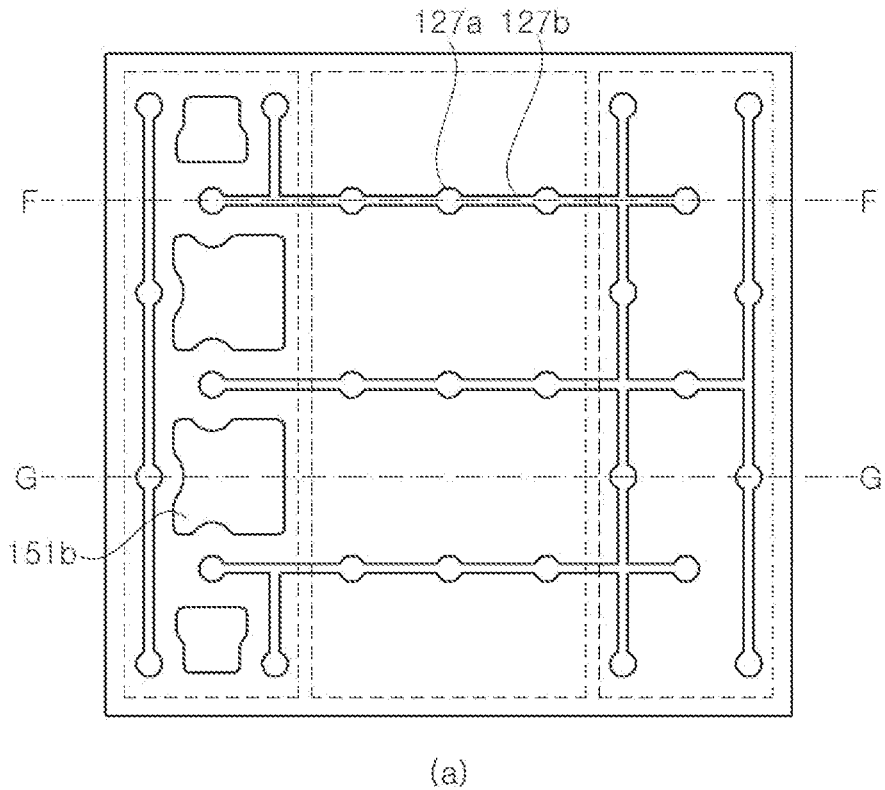
FIG. 16(*a*) through FIG. 18 are plan views and sectional views of an exemplary light emitting diode according to some embodiments.
Figure 16B:
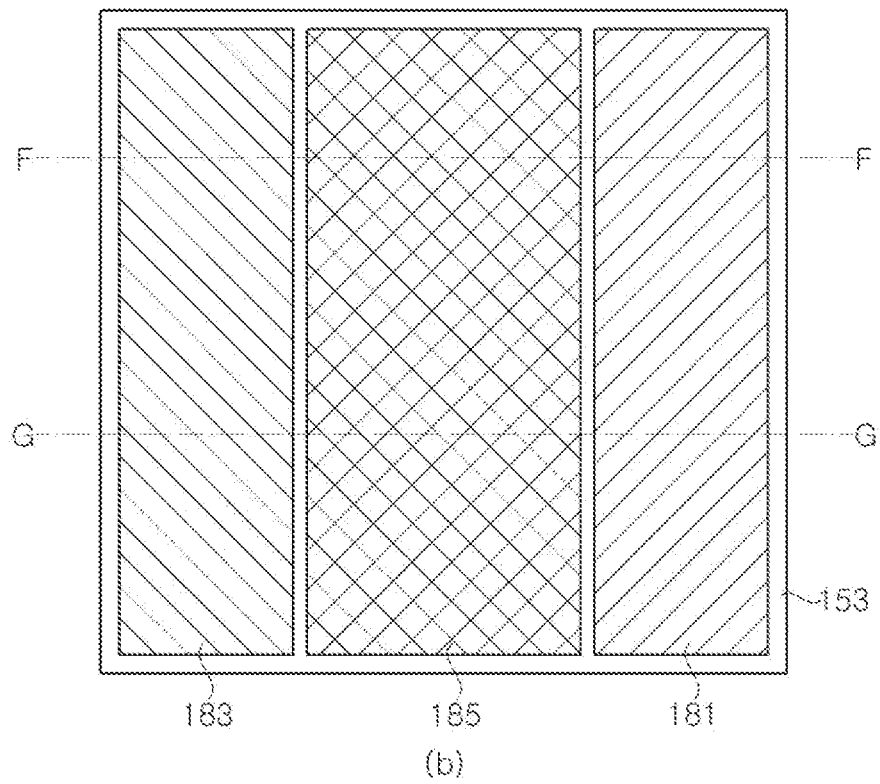
Figure 17:
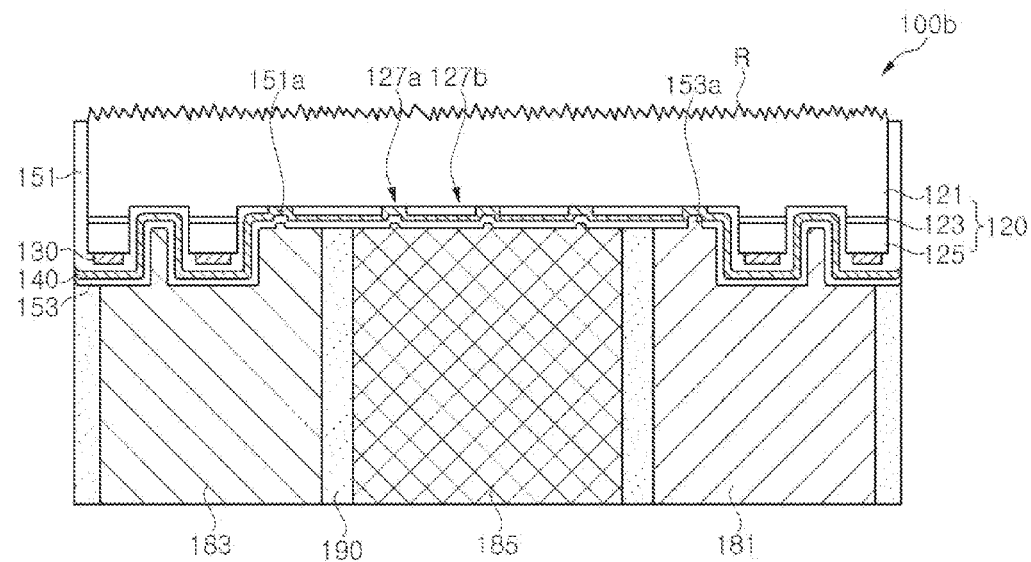
Figure 18:
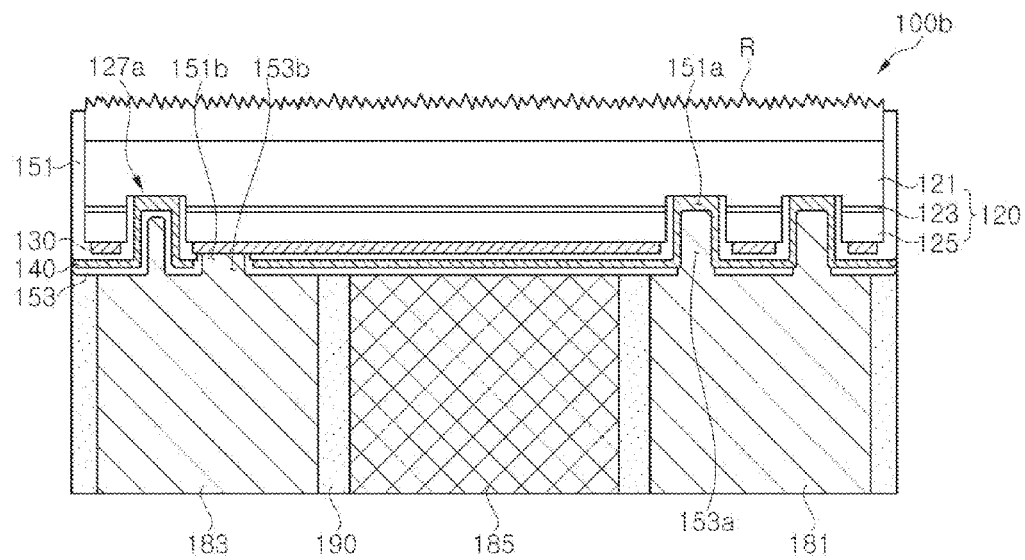

FIG. 16(a) through FIG. 18 are plan views and sectional views of a light emitting diode according to some embodiments. FIG. 16 (a) is a plan view illustrating locations of plural holes 127a and a connection structure 127b, and FIG. 16 (b) is a plan view illustrating a lower surface of a light emitting diode 100b. FIG. 17 and FIG. 18 are sectional views taken along lines F-F and G-T in FIGS. 16(a) and 16(b).

Referring to FIG. 16(a) through FIG. 18, the light emitting diode 100b includes a light emitting structure 120 which includes a first conductive type semiconductor layer 121, an active layer 123 and a second conductive type semiconductor layer 125, a second electrode 130, a first electrode 140, a first insulation layer 151, a first bump 181, a second bump

183, and a heat dissipation bump 185. In some implementations, the light emitting diode 100b can further include a second insulation layer 153 and an insulation material unit 190.

The light emitting structure 120 includes the first conductive type semiconductor layer 121, the active layer 123 disposed on the first conductive type semiconductor layer 121, and the second conductive type semiconductor layer 125 disposed on the active layer 123. Further, the light emitting structure 120 can include a plurality of holes 127a formed through the second conductive type semiconductor layer 125 and the active layer 123 such that the first conductive type semiconductor layer 121 is partially exposed therethrough, and can further include at least one connection structure 127b connecting the plurality of holes 127a to each other.

The plurality of holes 127a can be formed by partially removing the active layer 123 and the second conductive type semiconductor layer 125 such that an upper surface of the first conductive type semiconductor layer 121 is partially exposed therethrough. The number and location of the plural holes 127a are not particularly limited. For example, as shown in the drawings, the plurality of holes 127a can be arranged throughout the entirety of the light emitting structure 120.

In addition, the plurality of holes 127a can be connected to each other by the at least one connection structure 127b, which is formed by partially removing the active layer 123 and the second conductive type semiconductor layer 125 such that the upper surface of the first conductive type semiconductor layer 121 is partially exposed therethrough. For example, as shown in FIG. 16, the plurality of holes 127a can be connected by the at least one connection structure 127b. For example, all of the holes 127a can be connected.

As described below, the first electrode 140 can form ohmic contact with the first conductive type semiconductor layer 121 through the holes 127a. Accordingly, the plural holes 127a are disposed throughout the light emitting structure 120, thereby allowing substantially uniform current spreading throughout the light emitting structure 120. In addition, the plurality of holes 127a are connected by the connection structure 127b, whereby electric current can be substantially uniformly spread throughout the light emitting structure 120 instead of crowding at a certain hole 127a.

The light emitting structure 120 can include a roughness R on an upper surface thereof. The roughness R can be formed by dry etching and/or wet etching. For example, the roughness R can be formed by wet etching the upper surface of the light emitting structure 120 using a solution including at least one of KOH or NaOH, or by PEC etching. In some implementations, the roughness R can be formed by combination of wet etching and dry etching. It should be understood that these method for forming the roughness R are provided for illustration only, and the roughness R can be formed on the surface of the light emitting structure 120 using various methods known to those skilled in the art. The light emitting diode 100b can have improved light extraction efficiency by forming the roughness R on the surface of the light emitting structure 120.

Further, since the first electrode 140 forms ohmic contact with the first conductive type semiconductor layer 121 through the holes 127a, regions of the active layer 123 removed to form electrodes connected to the first conductive type semiconductor layer 121 are the same as the regions of the plurality of holes 127a. This structure can minimize an area of the first conductive type semiconductor layer 121 for ohmic contact with the metal layer, thereby providing a light emitting diode having a relatively large area ratio of light emitting area to a horizontal area of the overall light emitting structure.

The second electrode 130 is disposed on the second conductive type semiconductor layer 125. The second electrode 130 can partially cover a lower surface of the second conductive type semiconductor layer 125 while forming ohmic contact therewith. Further, the second electrode 130 can be disposed to cover the lower surface of the second conductive type semiconductor layer 125 and can be formed as a monolithic layer. In some implementations, the second electrode 130 can be formed to cover the remaining region of the lower surface of the second conductive type semiconductor layer 125 excluding the regions in which the plurality of holes 127a and the connection structure 127b are formed. With this structure, the light emitting diode can uniformly supply electric current to the entirety of the light emitting structure 120, thereby improving current spreading efficiency or current spreading performance.

However, it should be understood that the present disclosure is not limited thereto and other implementations are also possible. The second electrode 130 can be formed as a plurality of unit electrode layers disposed on the lower surface of the second conductive type semiconductor layer 125 instead of being formed as a monolithic layer. The second electrode 130 can include a reflective layer and a cover layer covering the reflective layer. The second electrode 130 according to this exemplary embodiment is generally similar to the second electrode according to the aforementioned exemplary embodiments, and a detailed description thereof will be omitted.

On the other hand, the light emitting diode 100b can further include a first insulation layer 151. The first insulation layer 151 can partially cover a lower surface of the light emitting structure 120 and the second electrode 130. In some implementations, the first insulation layer 151 can partially fill the connection structure 127b to be interposed between the first conductive type semiconductor layer 121 exposed through the connection structure 127b and the first electrode 140, and to be disposed in a region between the second electrode 130 and the first electrode 140, which excludes the plurality of holes 127a. In addition, the first insulation layer 151 covers side surfaces of the plurality of holes 127a while exposing upper surfaces of the holes 127a to partially expose the first conductive type semiconductor layer 121. Furthermore, the first insulation layer 151 can also cover a side surface of the light emitting structure 120.

The first insulation layer 151 can include a first opening 151a placed at a portion corresponding to the plurality of holes 127a and second openings 151b that partially expose the second electrode 130. The first conductive type semiconductor layer 121 can be partially exposed through the first opening 151a and the holes 127a, and the second electrode 130 can be partially exposed through the second openings 151b.

The first insulation layer 151 can include an insulation material, for example, $SiO_2$ or $SiN_x$. Further, the first insulation layer 151 can be composed of multiple layers, and can include a distributed Bragg reflector in which materials having different indexes of refraction are alternately stacked one above another.

The first electrode 140 can be disposed on the lower surface of the light emitting structure 120 and can fill the plurality of holes 127a and/or the first opening 151a to form ohmic contact with the first conductive type semiconductor layer 121. The first electrode 140 can be formed to cover the entirety of the first insulation layer 151 excluding some regions of the lower surface of the first insulation layer 151. Alternatively, although not shown in the drawings, the first electrode 140 can be formed to cover the side surface of the light emitting structure 120. When first electrode 140 is formed to cover the side surface of the light emitting structure 120, the first electrode 140 reflects light emitted through the side surface of the light emitting structure from the active layer 123 in an upward direction, thereby increasing a ratio of light emitted through the upper surface of the light emitting diode 100b. On the other hand, the first electrode 140 is not placed in a region corresponding to the second openings 151b of the first insulation layer 151, and is insulated from the reflective metal layer 130.

The first electrode 140 is formed to cover the overall lower surface of the light emitting structure 120 excluding some regions, thereby further improving current spreading efficiency or current spreading performance. In addition, since a portion of the light emitting structure 120 not covered by the second electrode 130 can be covered by the first electrode 140, light can be more effectively reflected, thereby improving luminous efficacy of the light emitting diode 100b. The first electrode 140 can form ohmic contact with the first conductive type semiconductor layer 121 while acting as a reflector reflecting light.

The light emitting diode 100b can further include the second insulation layer 153. The second insulation layer 153 can cover the first electrode 140. The second insulation layer 153 can include third openings 153a that partially expose the first electrode 140, and fourth openings 153b that partially expose the second electrode 130. Here, the fourth openings 153b can be formed at locations corresponding to the second openings 151b.

Each of the third and fourth openings 153a and 153b can be formed in a singular or plural numbers. In addition, when the third openings 153a are placed near one side of the light emitting diode, the fourth openings 153b can be placed near the other side thereof.

The second insulation layer 153 can include an insulation material, for example, $SiO_2$ or $SiN_x$. Further, the second insulation layer 153 can be composed of multiple layers and can include a distributed Bragg reflector in which materials having different indexes of refraction are alternately stacked one above another.

The first bump 181 can be disposed on a lower surface of the second insulation layer 153 and is electrically connected to the first electrode 140 through the third openings 153a. The second bump 183 can be disposed on the lower surface of the second insulation layer 153 and is electrically connected to the second electrode 130 through the fourth openings 153b. Accordingly, the first and second bumps 181 and 183 are electrically connected to the first and second conductive type semiconductor layers 121, 125, respectively. Accordingly, the first and second bumps 181, 183 can act as electrodes through which electric power is supplied from an external power source to the light emitting diode.

The heat dissipation bump 185 can be disposed on the lower surface of the second insulation layer 153 and can be disposed under the light emitting structure 120. The heat dissipation bump 185 can be physically connected to the light emitting structure 120 to dissipate heat from the light emitting structure 120 to the outside. Further, the heat dissipation bump 185 can be disposed between the first bump 181 and the second bump 183 to be disposed under a central portion of the light emitting structure 120. However, it should be understood that the present disclosure is not limited thereto and other implementations are also possible.

Arrangement of the heat dissipation bump 185, the first bump 181 and the second bump 183 can be changed in various ways as needed.

In addition, as in the embodiment shown in FIG. 13, the first and second bumps 181 and 183 and the heat dissipation bump 185 can include solders.

According to some embodiments, a light emitting device including the light emitting diode 100b according to the exemplary embodiment of FIG. 16 to FIG. 18 can be provided. According to this exemplary embodiment, the light emitting diode 100b has high current spreading efficiency or current spreading performance to allow application of high electric current while securing high heat dissipation efficiency even upon application of high electric current. Accordingly, the structure of the light emitting diode according to this exemplary embodiment is very suitable for a high output light emitting device.

FIG. 19(a) to FIG. 24(b) are plan views and sectional views of a light emitting diode chip and a method for manufacturing the same according to some embodiments. Specifically, the light emitting diode chip of FIGS. 24(a) and 24(b) can be manufactured by the manufacturing method described with reference to FIG. 19(a) through FIG. 24(b). In each of the drawings, (a) shows a plan view and (b) shows a sectional view taken along line H-H in the plan view.

Figure 19A:
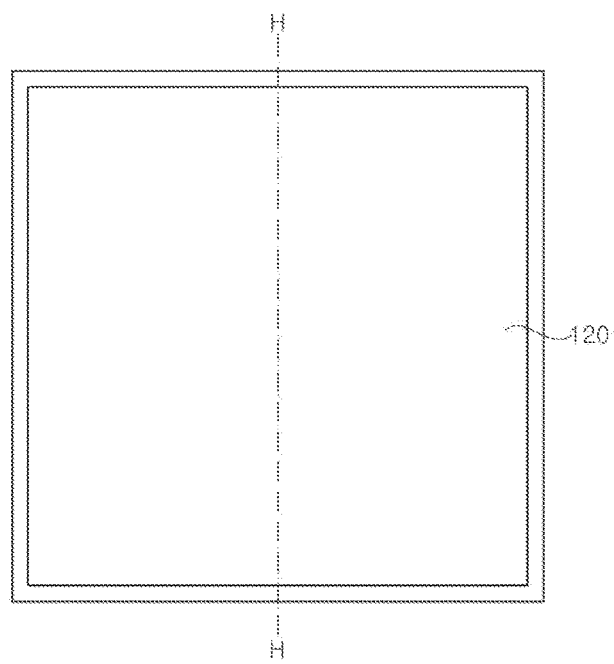
FIG. 19(*a*) through FIG. 24(*b*) are plan views and sectional views of an exemplary light emitting diode chip and a method for manufacturing the same according to some embodiments.
Figure 19B:
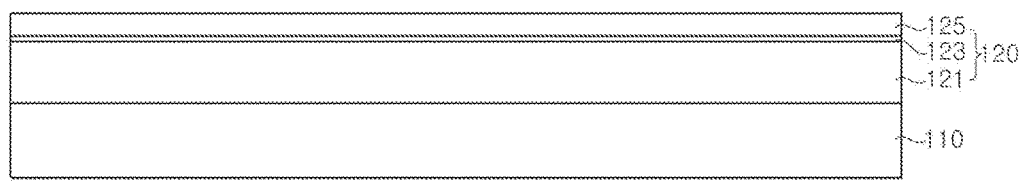

Referring to FIGS. 19(a) and 19(b), a light emitting structure 120 including a first conductive type semiconductor layer 121, an active layer 123, and a second conductive type semiconductor layer 125 is formed on a growth substrate 110.

As for the growth substrate 110, any substrate can be used so long as the substrate allows growth of the light emitting structure 120 thereon, and can include, for example, a sapphire substrate, a silicon carbide substrate, a silicon substrate, a gallium nitride substrate, an aluminum nitride substrate, and the like. In this exemplary embodiment, the growth substrate 110 can be a patterned sapphire substrate (PSS).

The light emitting structure 120 can be formed by sequentially growing the first conductive type semiconductor layer 121, the active layer 123, and the second conductive type semiconductor layer 125. The light emitting structure 120 can include a nitride semiconductor and can be formed by a method for growing a nitride semiconductor layer well-known to those skilled in the art, such as MOCVD, HYPE, or MBE, and the like. In addition, before growth of the first conductive type semiconductor layer 121, a buffer layer (not shown) can be further formed on the growth substrate 110. The first conductive type semiconductor layer 121 and the second conductive type semiconductor layer 125 can have different polarities. For example, the first conductive type semiconductor layer 121 can be doped with n-type impurities including Si, and the second conductive type semiconductor layer 125 can be doped with n-type impurities including Mg.

Figure 20A:
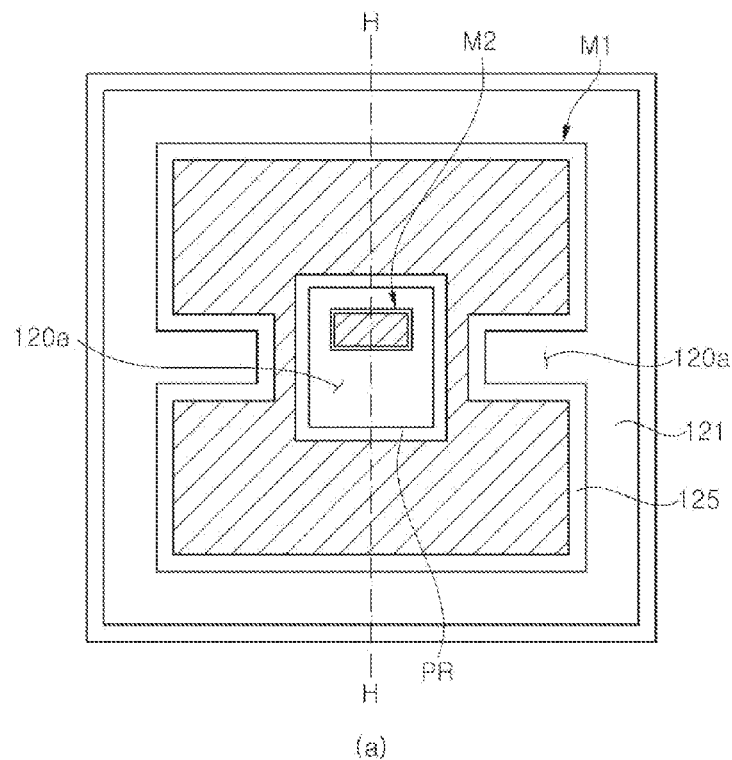
Figure 20B:
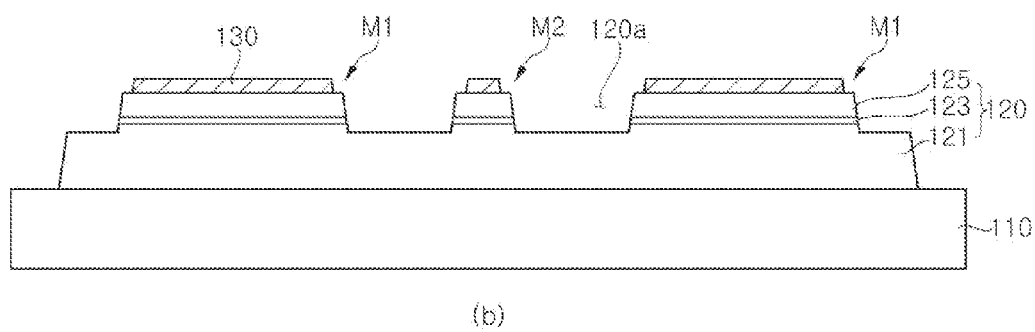

Next, referring to FIGS. 20(a) and 20(b), mesas M1 and M2 including the active layer 123 and the second conductive type semiconductor layer 125 are formed by patterning the light emitting structure 120, and a second electrode 130 is formed on the mesas M1 and M2. It should be noted that there is no sequential relationship between patterning of the light emitting structure 120 and formation of the second electrode 130.

Patterning of the light emitting structure 120 can include partially removing the light emitting structure 120 by, for example, photolithography and etching. The mesas M1 and M2 can be formed by patterning the light emitting structure 120, and can be formed to have inclined side surfaces using photoresist reflow technology. The inclined profile of the side surfaces of the mesas M1 and M2 improves extraction efficiency of light emitted from the active layer 123.

The mesas M1 and M2 can include a first mesa M1 and a second mesa M2, and in order to form the mesas M1 and M2, a partially exposed region 120a of the first conductive type semiconductor layer 121 can be formed in which the light emitting structure 120 is partially removed.

The first mesa M1 and the second mesa M2 can be separated from each other and the second mesa M2 can be formed to be surrounded by the first mesa M1. With this structure, the second mesa M2 can be placed at a central portion of the light emitting diode chip. As shown in the drawing, the first mesa M1 can be or include a monolithic mesa. The exposed region 120a of the first conductive type semiconductor layer 121 can be formed around the first mesa M1, and the shape of the first mesa M1 can be determined depending upon the shape of the exposed region 120a. For example, as shown in the drawings, the exposed region 120a of the first conductive type semiconductor layer 121 can be formed along a periphery of the light emitting diode chip, and can also be placed at a portion extending from the periphery of the light emitting diode chip towards the second mesa M2.

However, it should be understood that the present disclosure is not limited thereto and other implementations are also possible. The first mesa M1 can include a plurality of mesas and the exposed region 120a of the first conductive type semiconductor layer 121 can be modified in various ways. Further, as described below, the first mesa M1 can correspond to a light emitting area of a light emitting diode region LR and the second mesa M2 can correspond to a region of a protective diode region PR. Thus, the first mesa M1 can be modified in various ways according to a light emitting area to be defined.

The second electrode 130 is formed on the mesas M1 and M2 and covers at least part of an upper surface of the second conductive type semiconductor layer 125 to form ohmic contact with the second conductive type semiconductor layer 125. For example, the second electrode 130 can cover most of the upper surface of the second conductive type semiconductor layer 125, thereby improving current spreading efficiency or current spreading performance in the second conductive type semiconductor layer 125.

The second electrode 130 can form ohmic contact with the second conductive type semiconductor layer 125. Accordingly, the second electrode 130 can include a material capable of forming ohmic contact with a second conductive type nitride semiconductor layer. For example, when the second conductive type is a p-type, the second electrode 130 can include a conductive material capable of forming ohmic contact with a p-type nitride semiconductor layer. For example, the second electrode 130 can include a metal or a conductive oxide.

In some implementations, the second electrode 130 can include a metal capable of reflecting light. In this case, the, second electrode 130 can include a reflective layer (not shown) and a cover layer covering the reflective layer. The reflective layer and the cover layer can be formed by plating, deposition, and the like, and can be formed at a desired location by patterning or lift-off. In addition, the reflective layer and cover layer can be composed of a single layer or multiple layers. Alternatively, the second electrode 130 can include a transparent conductive material. When the second electrode 130 includes a transparent conductive material, the second insulation layer 153 described below can be formed to exhibit reflective characteristics, thereby providing a reflecting function.

Figure 21A:
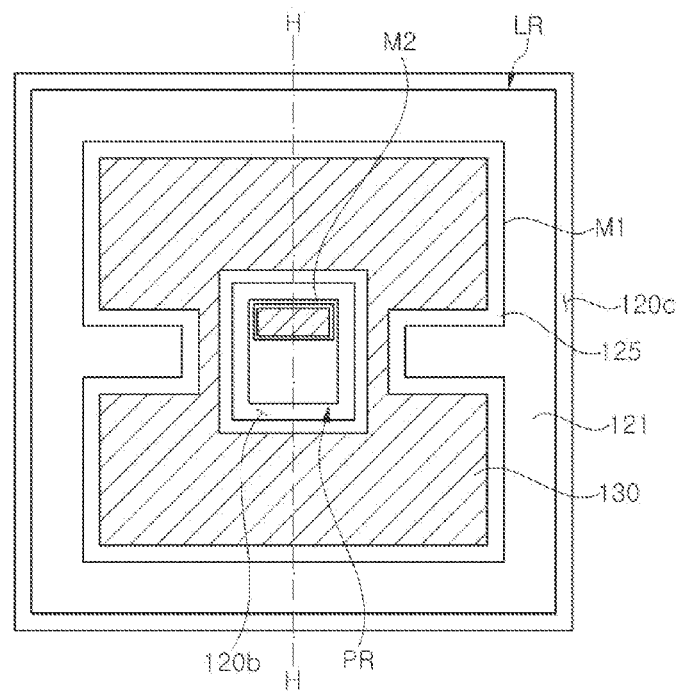
Figure 21B:
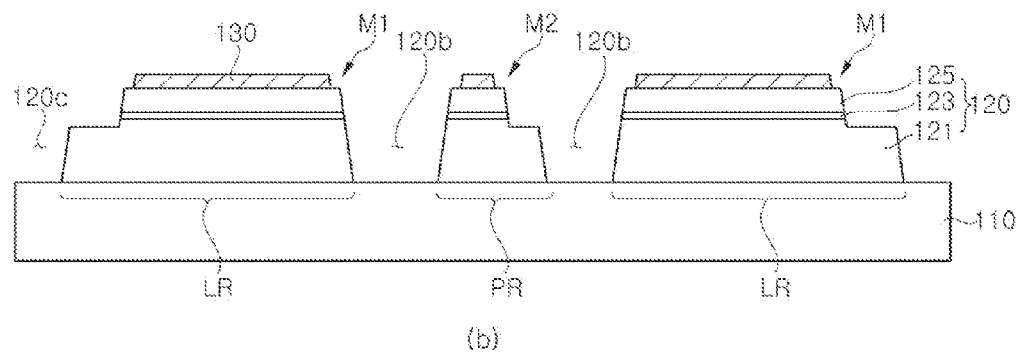

Referring to FIGS. 21(a) and 21(b), an isolation process can be performed to isolate the light emitting structure 120 into several regions. The isolation process can include removing a portion of the first conductive type semiconductor layer 121 under the exposed region 120a to form isolated regions 120b and 120c.

The isolation process can be performed by photolithography and etching. By the isolation process, the first conductive type semiconductor layer 121 around the mesas M1 and M2 is partially removed to form the isolated regions 120b and 120c, whereby the light emitting structure can be isolated into the semiconductor structure 120 including the first mesa M1 and the semiconductor structure 120 including the second mesa M2. For example, the light emitting structure 120 can be divided into at least two sections by the isolated region 120b. Here, the semiconductor structure 120 including the first mesa M1 is defined as the light emitting diode region LR, and the semiconductor structure 120 including the second mesa M2 is defined as the protective diode region PR. In addition, the light emitting diode region LR and the protective diode region PR are separated from each other.

The protective diode region PR can be placed at a central portion of the growth substrate 110, and thus, the light emitting diode region LR can be disposed to surround the protective diode region PR.

On the other hand, each of the light emitting diode region LR and the protective diode region PR can include an exposed region of the first conductive type semiconductor layer 121 in which the first mesa M1 and the second mesa M2 are not formed. For example, in the light emitting diode region LR, the exposed region of the first conductive type semiconductor layer 121 can be disposed to surround the first mesa M1.

Figure 22A:
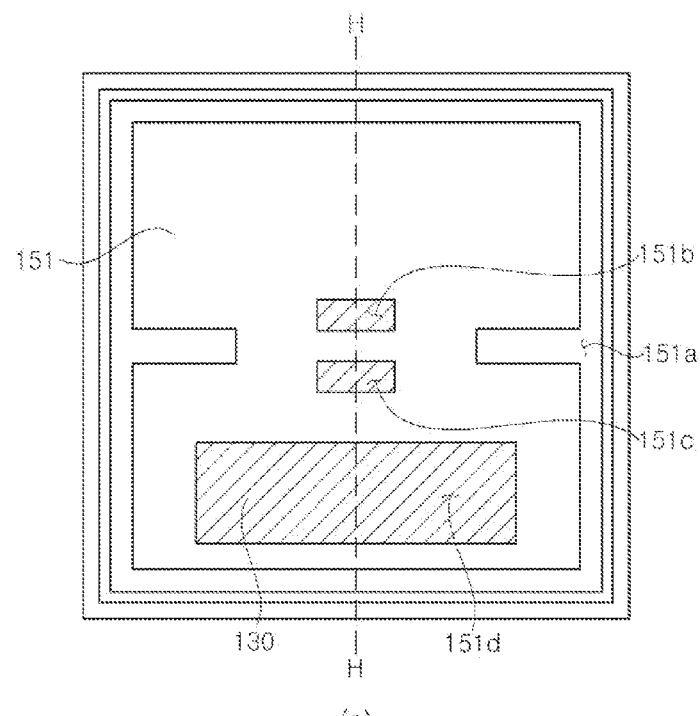
Figure 22B:
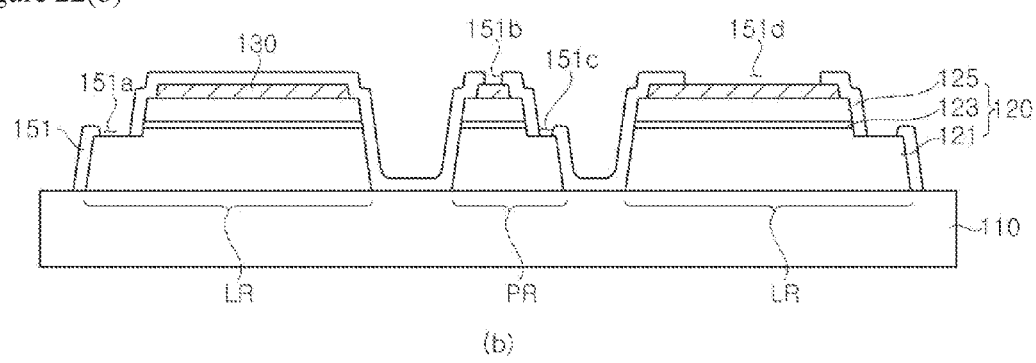

Next, referring to FIGS. 22(a) and 22(b), a first insulation layer 151 can be formed. The first insulation layer 151 covers at least part of the light emitting diode region LR, the protective diode region PR and the second electrode 130, and includes first and third openings 151a and 151c and second and fourth openings 151b and 151d.

The first insulation layer 151 can be formed over the entirety of the light emitting structure excluding the regions of the openings 151a to 151d. Here, the first and third openings 151a and 151c partially expose an upper surface of the first conductive type semiconductor layer 121, and the second and fourth openings 151b and 151d partially expose an upper surface of the second electrode 130.

In some implementations, the first opening 151a can expose the first conductive type semiconductor layer 121 of the light emitting diode region LR, and can be formed along an outer periphery of the light emitting diode chip to surround the first mesa M1. In addition, the first opening 151a can also be formed at a portion extending from the outer periphery of the light emitting diode chip towards the protective diode region PR side. On the other hand, the third opening 151c can at least partially expose the first conductive type semiconductor layer 121 of the protective diode region PR.

The second opening 151b can expose the second electrode 130 of the protective diode region PR. Here, the second opening 151b can be disposed biased towards one side of the light emitting diode chip, as shown in the drawing. On the other hand, the fourth opening 151d can at least partially expose the second electrode 130 of the light emitting diode region LR. Here, the third opening 151c can be disposed between the second opening 151b and the fourth opening 151d.

The first insulation layer 151 can include an insulation material, for example, $SiO_2$ or $SiN_x$. In addition, the first insulation layer 151 can be composed of multiple layers, and can include a distributed Bragg reflector in which materials having different indexes of refraction are alternately stacked one above another. Particularly, when the second electrode 130 includes a transparent conductive material, the first insulation layer 151 can include a reflective material or the distributed Bragg reflector. With this structure, the first insulation layer 151 can improve luminous efficacy of the light emitting diode while acting as a reflector that reflects light. The first insulation layer 151 can be formed by various methods depending upon formation materials. For example, the first insulation layer 151 can be formed by deposition.

Figure 23A:
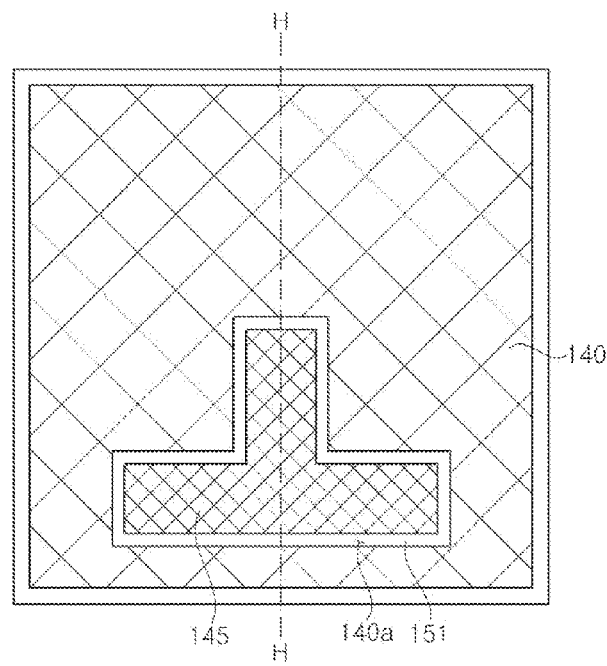
Figure 23B:
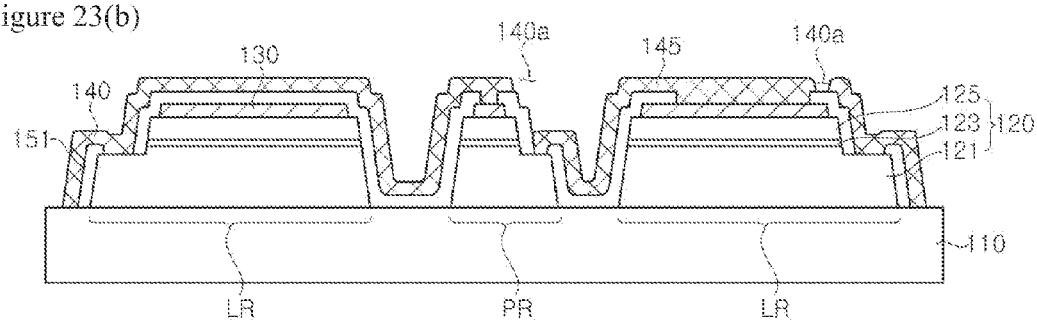

Next, referring to FIGS. 23(a) and 23(b), a first electrode 140 and a connection electrode 145 are formed on the first insulation layer 151 to cover the first insulation layer 151. Here, the first electrode 140 is separated from the connection electrode 145 and a separation region 140a can be formed therebetween.

The first electrode 140 can be formed to cover a substantially overall upper surface of the first insulation layer 151, and can fill the first opening 151a and the fourth opening 151d. The first electrode 140 can be insulated from the second electrode 130 and the first conductive type semiconductor layer 121 of the protective diode region PR, and thus is not formed at locations of the second opening 151b and the third opening 151c. With this structure, the first electrode 140 can be electrically connected to the first conductive type semiconductor layer 121 of the light emitting diode region LR through the first opening 151a, and can form ohmic contact with the first conductive type semiconductor layer 121. Further, the first electrode 140 can be electrically connected to the second electrode 130 of the protective diode region PR through the fourth opening 151d. Accordingly, the first conductive type semiconductor layer 121 of the light emitting diode region LR is electrically connected to the second conductive type semiconductor layer 125 of the protective diode region PR through the first electrode 140.

The connection electrode 145 is separated from the first electrode 140 and can be formed in a region in which the first electrode 140 is not formed. For example, the connection electrode 145 can be formed in a region, in which the first electrode 140 is not formed and the second and third openings 151b and 151c are placed, whereby the second and third openings 151b and 151c can be filled with the connection electrode 145. With this structure, the connection electrode 145 can be electrically connected to the second electrode 130 of the light emitting diode region LR through the second openings 151b, and electrically connected to the first conductive type semiconductor layer 121 of the protective diode region PR through the third opening 151c, and can form ohmic contact with the first conductive type semiconductor layer 121. Accordingly, the second electrode 130 of the light emitting diode region LR and the first conductive type semiconductor layer 121 of the protective diode region PR are electrically connected to each other through the connection electrode 145.

As described above, the first and second conductive type semiconductor layers 121 and 125 of the light emitting diode region LR are electrically connected to the second and first conductive type semiconductor layers 125 and 121 of the protective diode region PR, respectively. Accordingly, the light emitting diode region LR and the protective diode region PR are connected to each other in reverse parallel. Accordingly, in operation of the light emitting diode chip according to the exemplary embodiment, the protective diode region PR can perform a similar function to that of a Zener diode connected to the light emitting diode region LR in reverse parallel, thereby preventing damage or failure of the light emitting diode region LR due to electrostatic discharge.

On the other hand, the first electrode 140 and the connection electrode 145 can include a metallic material capable of forming ohmic contact with a nitride semiconductor and can have high reflectivity. The first electrode 140 and the connection electrode 145 including a metallic material can be formed on the first insulation layer 151 by plating or deposition. Further, the first electrode 140 and the connection electrode 145 can be formed at the same time and can include the same material. However, it should be understood that the present disclosure is not limited thereto and other implementations are also possible.

Figure 24A:
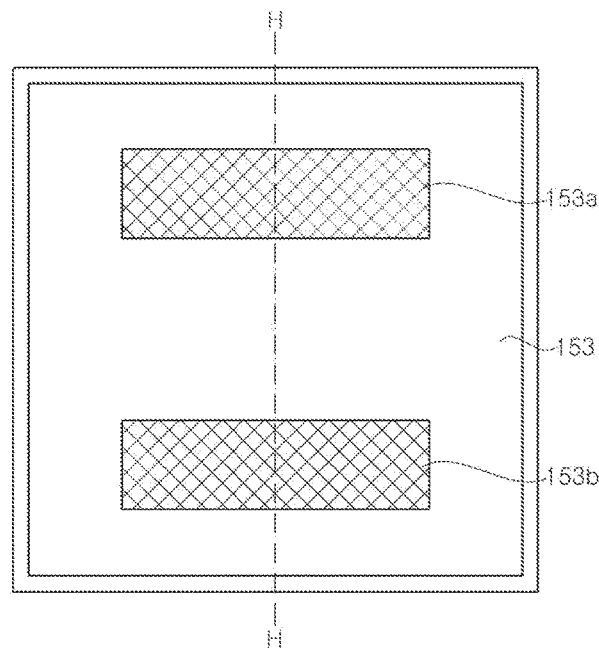
Figure 24B:
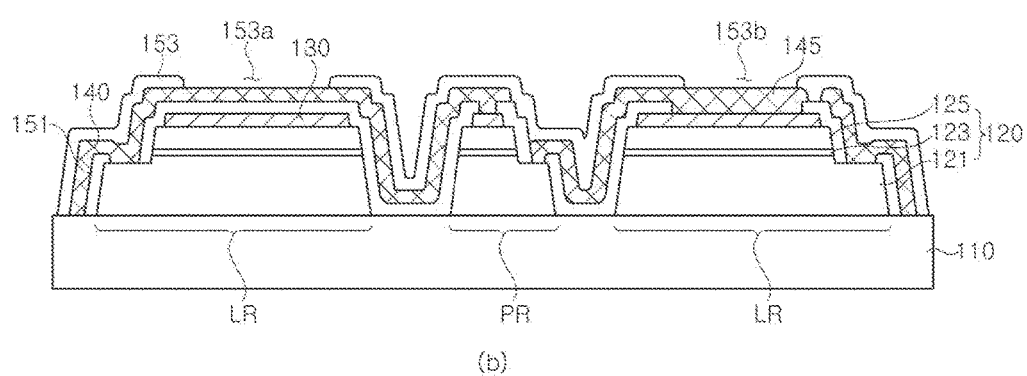

Next, referring to FIGS. 24(a) and 24(b), a second insulation layer 153 can be formed to cover at least part of the first electrode 140 and the connection electrode 145. As a result, a flip-chip type light emitting diode chip as shown in FIGS. 24(a) and 24(b) is provided.

The second insulation layer 153 can include an insulation material, for example, $SiO_2$ or $SiN_x$. Further, the second insulation layer 153 can be composed of multiple layers and can include a distributed Bragg reflector in which materials having different indexes of refraction are alternately stacked one above another. The second insulation layer 153 can be formed of or include a different material than the first insulation layer 151. For example, the first insulation layer 151 can include $SiO_2$ and the second insulation layer 153 can include $SiN_x$. In addition, the first insulation layer 151 can have a greater thickness than the second insulation layer 153. When the first insulation layer 151 has a relatively large thickness, the light emitting structure 120 can be more effectively protected from electrostatic discharge and can be prevented from being damaged by external moisture.

The second insulation layer 153 can be formed by various methods depending upon formation materials. For example, the second insulation layer 153 can be formed by deposition. Further, a fifth opening 153a and a sixth opening 153b can be formed by partially etching the second insulation layer 153. Alternatively, the fifth opening 153a and the sixth opening 153b can be formed by a lift-off process after deposition of the second insulation layer 153.

The second insulation layer 153 can include the fifth opening 153a that partially exposes the first electrode 140 and the sixth opening 153b that partially exposes the connection electrode 145. The portions of the first electrode 140 and the connection electrode 145 respectively exposed through the fifth opening 153a and the sixth opening 153b can provide regions to be electrically connected to an external power source during the operation of the light emitting diode chip. Thus, the light emitting diode chip according to this exemplary embodiment does not include bumps, and thus can be used in various application ranges that require a slim light emitting diode chip.

When external power is supplied to the light emitting diode chip through the first electrode 140 and the connection electrode 145, light is emitted through recombination of holes and electrons in the active region 123 of the light emitting diode region LR. On the other hand, since the protective diode region PR is connected to the light emitting diode region LR in reverse parallel, the light emitting diode chip does not emit light even upon application of electric power thereto. Accordingly, in operation of the light emitting diode chip, since light is not generated in the protective diode region PR, a dark portion is created in a region in which the protective diode region PR is placed.

On the other hand, the growth substrate 110 can be removed from the first conductive type semiconductor layer 121. The growth substrate 110 can be removed from the light emitting structure 120 by a technology known to those skilled in the art. The growth substrate 110 can be separated or removed from the light emitting structure by a physical/chemical process, for example, laser lift-off, chemical lift-off, stress lift-off, or polishing, and the like.

Next, the light emitting diode chip according to this exemplary embodiment will be described. Here, repeated descriptions of components having the same reference numerals as those of the aforementioned exemplary embodiment will be omitted.

The light emitting diode chip according to the exemplary embodiment includes a light emitting diode region LR and a protective diode region PR connected to the light emitting diode region LR in reverse parallel. Here, the protective diode region PR can be placed at a central portion of the light emitting diode chip and can be disposed to be surrounded by the light emitting diode region LR.

Each of the light emitting diode region LR and the protective diode region PR can include the first conductive type semiconductor layer 121, and mesas M1 and M2 disposed on the first conductive type semiconductor layer 121 and including the active layer 123 and the second conductive type semiconductor layer 125 disposed on the active layer 123. The mesas M1 and M2 can include a first mesa M1 disposed on the light emitting diode region LR and a second mesa M2 disposed on the protective diode region PR.

Furthermore, the light emitting diode chip can include a second electrode 130 disposed on the mesas M1 and M2, a first insulation layer 151 covering the second electrode 130 and the mesas M1 and M2 and including openings that partially expose the first conductive type semiconductor layer 121 and the second electrode 130, a first electrode 140, and a connection electrode 145. Here, the first conductive type semiconductor layer 121 of the light emitting diode region LR can be electrically connected to the second electrode 130 of the protective diode region PR by the first electrode 140, and the first conductive type semiconductor layer 121 of the protective diode region PR can be electrically connected to the first conductive type semiconductor layer 121 of the light emitting diode region LR by the connection electrode 145. With this structure, the light emitting diode region LR and the protective diode region PR can be connected to each other in reverse parallel.

Further, the light emitting diode chip can further include a second insulation layer 153, which partially covers the first electrode 140 and the connection electrode 145 and includes openings partially exposing the first electrode 140 and the connection electrode 145.

As such, according to the exemplary embodiment, a flip-chip type light emitting diode chip including the protective diode region PR and the light emitting diode region LR in one chip can be provided. With such a light emitting diode chip, it is possible to prevent damage to the light emitting diode due to electrostatic discharge without a separate protection device.

Figure 25A:
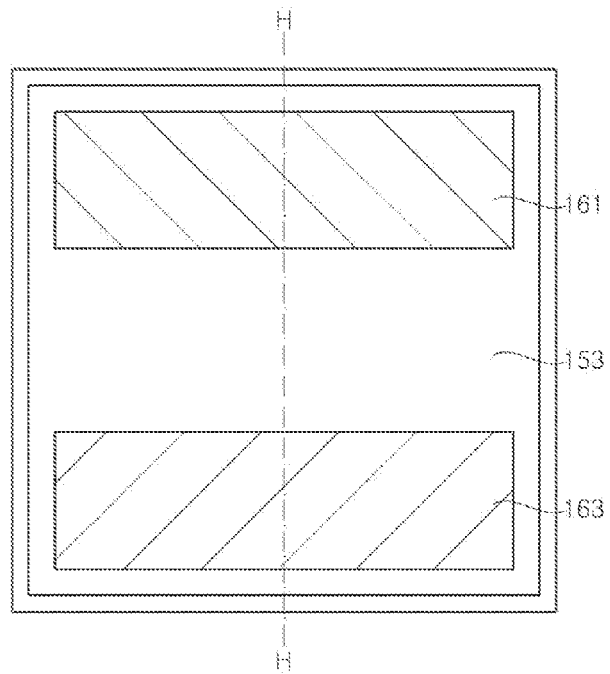
FIG. 25(*a*) and FIG. 25(*b*) are plan views and sectionals view of an exemplary light emitting diode chip and a method for manufacturing the same according to some embodiments.
Figure 25B:
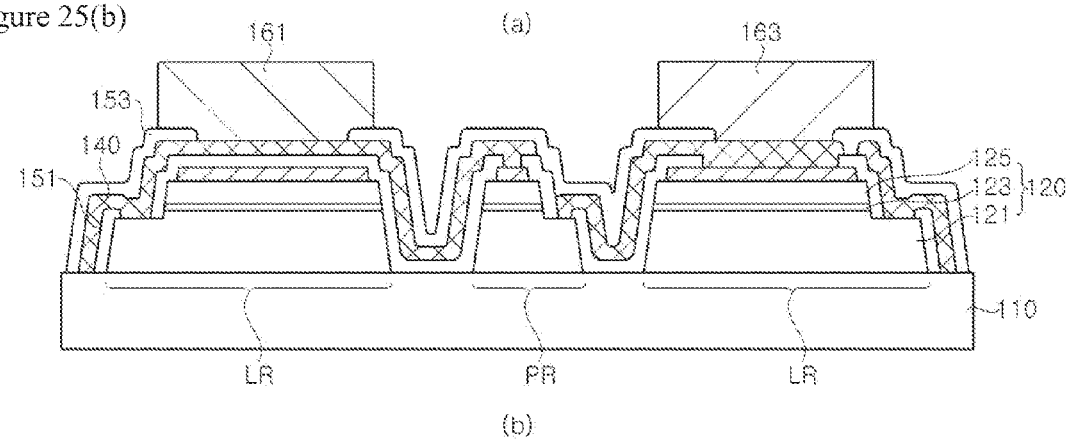

FIGS. 25(a) and 25(b) represent a plan view and a sectional view of a light emitting diode chip and a method for manufacturing the same according to some embodiments.

The light emitting diode chip according to the exemplary embodiment of FIG. 25 is generally similar to the light emitting diode chip shown in FIG. 24, and further includes a first electrode pad 161 and a second electrode pad 163. Hereinafter, different features of the light emitting diode chip according to this exemplary embodiment will be mainly described and detailed descriptions of the same features will be omitted.

Referring to FIGS. 25(a) and 25(b), in addition to the features of the light emitting diode chip shown in FIGS. 24(a) and 24(b), the light emitting diode chip according to this exemplary embodiment can further include the first electrode pad 161 and the second electrode pad 163.

The first electrode pad 161 and the second electrode pad 163 can be formed on the second insulation layer 153. The first electrode pad 161 can fill the fifth opening 153a to be electrically connected to the first electrode 140, and the second electrode pad 163 can fill the sixth opening 153b to be electrically connected to the connection electrode 145. Accordingly, the first and second electrode pads 161 and 163 can serve as electrodes through which electric power is supplied from an external power source to the light emitting diode. In addition, the first electrode pad 161 can be electrically insulated from the second electrode pad 163 and can be separated therefrom.

The first electrode pad 161 and the second electrode pad 163 can include a bonding layer, such as a Ti, Cr or Ni layer, and a highly conductive layer such as an Al, Cu, Ag or Au layer. The first electrode pad 161 and the second electrode pad 163 can be formed on the second insulation layer 153 by plating or depositing these metals. In addition, the first electrode pad 161 and the second electrode pad 163 can be formed at the same time by the same process, without being limited thereto.

Figure 26A:
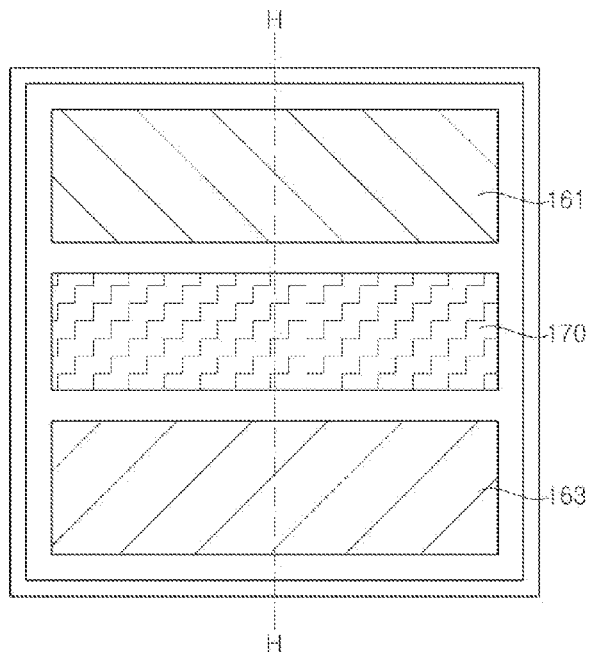
FIG. 26(*a*) and FIG. 26(*b*) are plan views and sectional views of an exemplary light emitting diode chip and a method for manufacturing the same according to some embodiments.
Figure 26B:
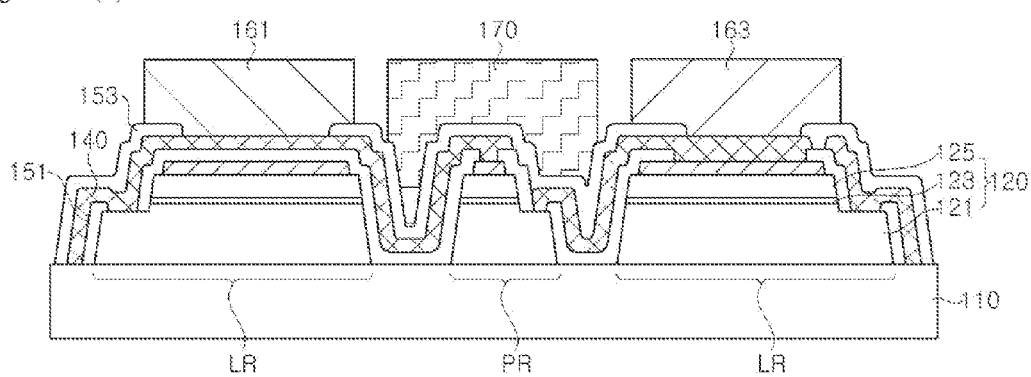

FIGS. 26(a) and 26(b) represent a plan view and a sectional view of a light emitting diode chip and a method for manufacturing the same according to some embodiments.

The light emitting diode chip according to the exemplary embodiment shown in FIGS. 26(a) and 26(b) are generally similar to the light emitting diode chip shown in FIGS. 25(a) and 25(b), and further includes a heat dissipation pad 170. Hereinafter, different features of the light emitting diode chip according to this exemplary embodiment will be mainly described and detailed descriptions of the same features will be omitted.

Referring to FIGS. 26(a) and 26(b), the light emitting diode chip further includes the heat dissipation pad 170 in addition to the features of the light emitting diode chip of FIGS. 25(a) and 25(b).

The heat dissipation pad 170 can be formed on the second insulation layer 153 and can be electrically insulated from the light emitting structure 120. In addition, the heat dissipation pad 170 can be disposed between the first and second electrode pads 161 and 163, and can be electrically insulated from the bumps 171 and 173. The heat dissipation pad 170 can be formed by plating or deposition of a material having high thermal conductivity, for example, Cu.

The light emitting diode chip according to this exemplary embodiment includes the heat dissipation pad 170 to allow effective heat dissipation upon light emission, and can improve lifespan and reliability of a high output large flip-chip type light emitting diode chip.

Figure 27:
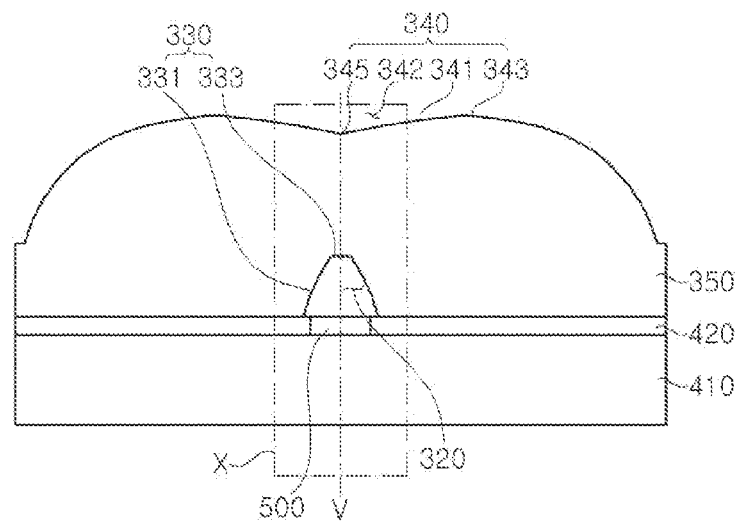
FIG. 27 through FIG. 29 are a sectional view, a perspective view and an enlarged sectional view of an exemplary light emitting device according to some embodiments.
Figure 28:
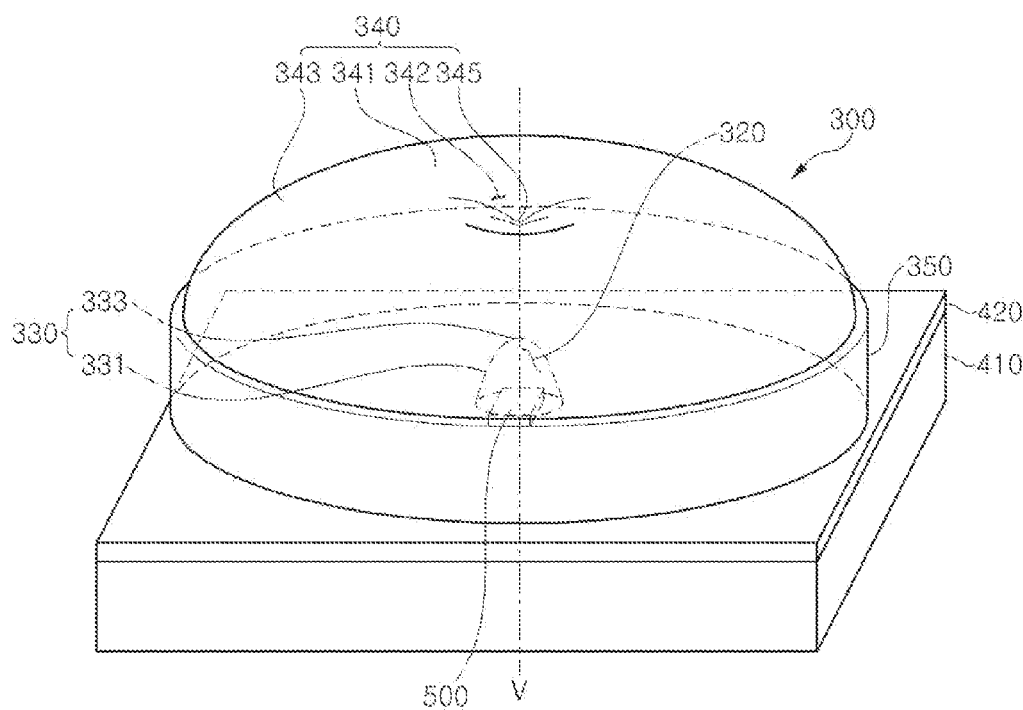
Figure 29:
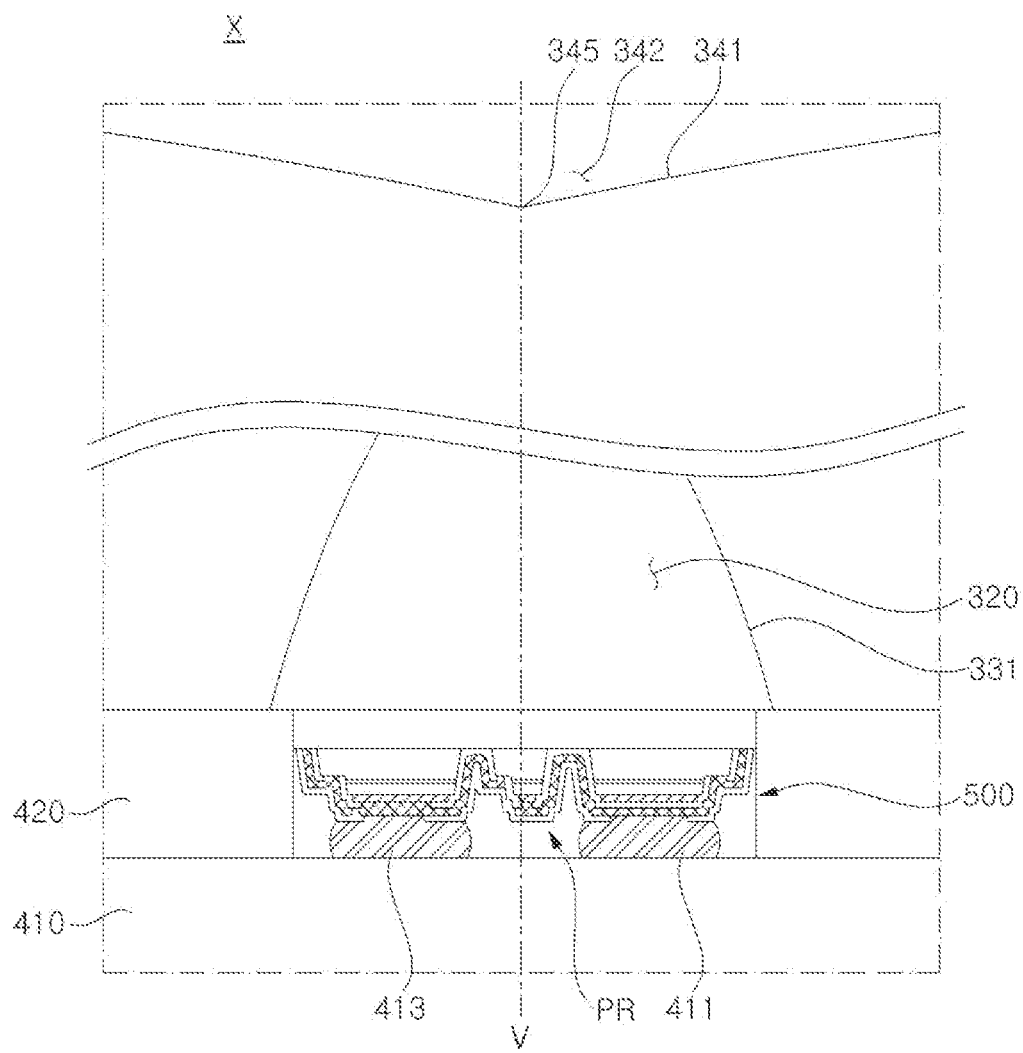

FIG. 27 to FIG. 29 are a sectional view, a perspective view and an enlarged sectional view of a light emitting device according to some embodiments. Specifically, FIG. 27 and FIG. 28 are a sectional vied and a perspective view of the light emitting device, and FIG. 28 is an enlarged view of section X of FIG. 27.

The light emitting device according to this exemplary embodiment includes a light emitting diode chip 500 and a lens 300. The light emitting device can further include a substrate 410 supporting the light emitting diode chip 500, and a reflective sheet 420.

The light emitting diode chip 500 can be or include a flip-chip type light emitting diode chip which includes a light emitting diode region and a protective diode region connected to the light emitting diode in reverse parallel. For example, the light emitting diode chip 500 can be or include a light emitting diode in which the light emitting diode region and the protective diode region are formed in a single chip. Further, since the light emitting diode chip 500 has a flip-chip structure, the light emitting diode chip 500 can omit a wire for electrically connecting the light emitting diode chip 500 to the substrate 210.

The light emitting diode chip 500 can include the light emitting diode chips according to the exemplary embodiment of FIGS. 24(a) and 24(b), FIGS. 25(a) and 25(b) or FIGS. 26(a) and 26(b). As shown in FIG. 29, the light emitting diode chip 500 according to this exemplary embodiment will be described as the light emitting diode chip shown in FIGS. 24(a) and 24(b). Accordingly, in the light emitting diode chip 500, the protective diode region PR can be placed at the center thereof. However, it should be understood that the present disclosure is not limited thereto and other implementations are also possible. Various modifications can be made to the light emitting diode chips without departing from the scope of the disclosure.

The substrate 410 can be or include a conductive or insulating substrate, and can include, for example, a polymer substrate, a ceramic substrate, a metal substrate, or a printed circuit board. In addition, the flip-chip type light emitting diode chip 500 is mounted on the substrate 410 and thus can act as a chip mounting member. Further, the substrate 410 can act as a support member on which the lens 300 will be seated.

The substrate 410 can include leads (not shown) that can be electrically connected to the flip-chip type light emitting diode. When the substrate 410 is a printed circuit board, printed circuits can correspond to the leads.

For example, as shown in FIG. 29, the light emitting diode chip 500 can be mounted on the substrate 410, and the first electrode 140 and the connection electrode 145 can be bonded onto the substrate via conductive bonding materials 411 and 413 such as solders. Here, the substrate 410 is electrically connected to the light emitting diode chip 500 by the conductive bonding materials 411 and 413. When the substrate 410 includes the leads, the conductive bonding materials 411 and 413 can contact the leads to electrically connect the substrate 410 to the light emitting diode chip 500.

The reflective sheet 420 can be placed near a side surface of the light emitting diode chip 500 between the lens 300 and the substrate 410, and can contact the side surface of the light emitting diode chip 500. The reflective sheet 420 can be coated with a white reflective material having high reflectivity in order to reflect light in a wide wavelength range of visible light. Accordingly, the reflective sheet 420 can reflect light into the lens 300.

The lens 300 can include a lower surface 330 and an upper surface 340, and can further include a flange 350.

The lower surface 330 of the lens 300 can be formed with a lower concave section 320, and the light emitting diode chip 500 can be disposed under the lower concave section 320. Alternatively, the light emitting diode chip 500 can be placed within the lower concave section 320.

An inner surface of the lower concave section 320 is defined as a light incident face 330 through which light emitted from the light emitting diode chip 500 is incident on the lens 300. The light incident face 330 includes a side surface 331 and can further include a top surface disposed on the side surface 331. The lower concave section 320 can have a shape, the width of which is gradually decreased upwards from a lower entrance such that the side surface 331 of the light incident face 330 has a slope. Here, the side surface 331 can have a shape in which an inclination of a tangent line thereof decreases. Alternatively, the side surface can have a shape in which the inclination of the tangent line thereof is constant or increases.

The top surface 333 of the light incident face 330 can have a flat shape such that the lower concave section 320 can have a truncated vertically sectional shape, without being limited thereto. Alternatively, the top surface 333 of the light incident face 330 can have a convex shape.

The upper surface 340 of the lens 300 is configured to allow light having entered the lens 300 and discharged from the lens 300 to have a wide beam angle and uniform beam distribution. As shown, the upper surface 340 of the lens 300 can include an upper concave section 342, which can be placed in a central region of the lens 300 and can include a central portion 345 at the center thereof. In addition, the upper surface 340 of the lens 300 can further include an inner surface 341 surrounding the central portion 345 of the upper concave section and an outer surface 343 surrounding the inner surface 341.

Each of the inner surface 341 and the outer surface 343 can have a convex shape. An inclination of a tangent line on the inner surface 341 can be opposite to the inclination of the tangent line on the outer surface 343. For example, in a certain shape where the lower surface of the lens 300 is defined as the x-axis and a virtual central axis V is defined as the y-axis, the inclination of the inner surface 341 can have a positive value and the inclination of the outer surface 343 can have a negative value. Accordingly, a height of an adjoining portion between the inner surface 341 and the outer surface 343 can correspond to the highest point of the lens 300. However, it should be understood that the present disclosure is not limited thereto and other implementations are also possible. The shape of the upper surface can be modified in various ways by taking into account the beam angle and the like.

By the upper concave section 342 and the inner surface 341 of the upper surface 340, light traveling near the central region of the lens 300 is distributed outwards, and the outer surface 343 increases the intensity of light emitted outwards from the central axis V of the lens 300. In addition, the light emitting diode generally has the highest intensity of light travelling in an upward direction perpendicular to the light emitting diode. According to the exemplary embodiment, the lens 300 has the upper concave section 342 at the center thereof such that light travelling in the upward direction perpendicular to the light emitting diode can be scattered or reflected towards the side surface thereof, thereby relieving concentration of light on the central region of the light emitting device. In summary, light having entered the lens 300 and discharged therefrom can have a wide beam angle and uniform beam distribution.

On the other hand, the upper concave section 342 of the lens 300 can be placed above the light emitting diode chip 500, for example, above the protective diode region. When the protective diode region is place at the center of the light emitting diode chip 500, the upper concave section 342 can be placed at the center of the upper surface 340 of the lens 300. In addition, both the central portion 345 of the upper concave section and the protective diode region can be disposed on the central axis V.

Hereinafter, this structure will be described in more detail with reference to FIG. 29. The protective diode region PR of the light emitting diode chip 500 is placed at the center of the light emitting diode. In addition, the upper concave section 342 is placed at the center of the lens 300. Accordingly, the protective diode region PR and the central portion 345 of the upper concave section 342 can be aligned on the virtual central axis V of the lens perpendicular to the upper surface of the light emitting diode chip 500.

As described above, the lens 300 according to the exemplary embodiment scatters or reflects light, which travels in the upward direction perpendicular to the light emitting diode chip 500, towards the side surface thereof, thereby preventing concentration of light on an upper portion of the central region of the light emitting device. That is, since light emitted through the center of the light emitting diode chip is guided to travel in a different direction by the lens 300 instead of traveling in the upward direction perpendicular to the light emitting diode, the light emitting device does not suffer from deterioration in luminous uniformity due to the intensity of light emitted from the center of the light emitting diode chip, thereby providing wide and uniform beam distribution of light. Further, the light emitting device according to the exemplary embodiment can more effectively prevent concentration of light above the center of the lens 300 upon light emission.

Accordingly, the location of the protective diode region PR corresponding to the dark portion of the light emitting diode chip 500 in which light is not generated is aligned perpendicular to the central portion 345 of the upper concave section of the lens 300, thereby minimizing deterioration in luminous uniformity caused by the dark portion of the light emitting diode chip 500.

Furthermore, the light emitting diode chip 500 includes the protective diode region, thereby eliminating a need for a separate protection device, for example, a Zener diode, on the substrate 210. Accordingly, the light emitting device can be manufactured by a simple process with reduced manufacturing costs, thereby improving yield of the light emitting device.

Referring again to FIG. 27 and FIG. 28, the flange 350 can be disposed between the upper surface 340 and the lower surface 330, and defines the size of the lens 300. The flange 350 can have a convex-concave pattern on a side surface and a lower surface thereof, thereby improving light extraction efficiency of the lens 300. Although not shown in the drawings, the flange 350 can be further formed with a leg at a lower side thereof such that the leg is coupled to the substrate 210 to hold the lens 300.

Only a few embodiments, implementations and examples are described and other embodiments and implementations, and various enhancements and variations can be made based on what is described and illustrated in this document.

What is claimed is:

1. A light emitting device comprising:
   a substrate including a base and a conductive pattern disposed over the base; and
   a light emitting diode mounted on the substrate,
   wherein the light emitting diode includes:
   a light emitting structure including a first conductive type semiconductor layer, a second conductive type semiconductor layer disposed under the first conductive type semiconductor layer, and an active layer disposed between the first conductive type semiconductor layer and the second conductive type semiconductor layer, wherein the light emitting structure is disposed to form openings exposing a corresponding portion of the first conductive type semiconductor layer;
   a first electrode forming ohmic contact with the first conductive type semiconductor layer through the exposed portion of the first conductive type semiconductor layer;
   a second electrode disposed under the second conductive type semiconductor layer and forming ohmic contact with the second conductive type semiconductor layer;
   a first insulation layer partially covering the first electrode and the second electrode;
   a first bump and a second bump disposed under the light emitting structure and electrically connected to the first electrode and the second electrode, respectively through the conductive pattern; and
   a heat dissipation bump disposed under the light emitting structure and above the substrate and contacting the base,
   wherein at least one of the openings formed on the light emitting structure is disposed to form a connection structure connecting at least two other of the openings,
   the first bump, the second bump and the heat dissipation bump are separated from one another,
   the heat dissipation bump has higher thermal conductivity than the first and second bumps, and
   wherein the conductive pattern includes a first conductive pattern electrically connected to the first bump and a second conductive pattern electrically connected the second bump, and the base includes a protrusion disposed between the first and second conductive patterns.

2. The light emitting device of claim 1, wherein the light emitting diode further includes an insulation layer covering side surfaces of the first bump, the second bump and the heat dissipation bump.

3. The light emitting device of claim 2, wherein a lower surface of the insulation layer, a lower surface of the first bump, a lower surface of the second bump, and a lower surface of the heat dissipation bump are flush with one another.

4. The light emitting device of claim 3, wherein the base includes an upper surface of the protrusion is flush with an upper surface of the conductive pattern.

5. The light emitting device of claim 2, wherein at least one of the first bump, the second bump, or the heat dissipation bump includes solders.

6. The light emitting device of claim 1, wherein the heat dissipation bump is disposed between the first bump and the second bump.

7. The light emitting device of claim 1, wherein the heat dissipation bump contacts an upper surface of the protrusion.

8. The light emitting device of claim 1, wherein the light emitting diode further includes an insulation layer disposed between the light emitting structure and the heat dissipation bump.

9. The light emitting device of claim 1, wherein the first and second bumps are bonded to the conductive pattern.

10. The light emitting device of claim 9, wherein the first bump and the second bump directly contact a portion of the first electrode and a portion of the second electrode, respectively.

11. The light emitting device of claim 1, further including:
an insulation pattern disposed between the base and the conductive pattern,
wherein the base and the conductive pattern include metal.

12. The light emitting device of claim 1, wherein the second electrode has a monolithic structure.

13. A light emitting device comprising:
a first mesa and a second mesa, each including a first conductive type semiconductor layer, a second conductive type semiconductor layer, and an active layer interposed between the first and second conductive type semiconductor layers, wherein the first mesa and the second mesa are formed in a light emitting diode region and a protective diode region, respectively, and the first mesa and the second mesa are disposed to expose the corresponding first conductive semiconductor layer in the light emitting diode region and the protective diode region;
a second electrode formed over the first mesa and the second mesa and electrically connected to the second conductive type semiconductor layer in the light emitting diode region and the protective diode region;
a first insulation layer covering portions of the first mesa and the second mesas, wherein the first insulation layer is disposed to form openings exposing the first conductive type semiconductor layer and the second electrode in the light emitting diode region and the protective diode region;
a first electrode disposed over a portion of the first insulation layer and electrically connected to the first conductive type semiconductor layer of the light emitting diode region and the second electrode of the protective diode region through some of the openings in the first insulating layer;
a connection electrode disposed over another portion of the first insulation layer and electrically connected to the first conductive type semiconductor layer of the protective diode region and the second electrode of the light emitting diode region through some other of the openings in the first insulating layer; and
a second insulation layer formed to cover at least a portion of the first insulation layer and the connection electrode.

14. The light emitting device of claim 13, wherein the second insulation layer is disposed to form openings exposing the first insulation layer in the light emitting diode region and the protective diode region.

15. The light emitting device of claim 14, further comprising:
a first electrode pad and a second electrode pad formed over the second insulation layer, the first electrode pad being electrically connected to the first electrode through one of the openings and the second electrode pad being electrically connected to the connection electrode through another of the openings.

16. The light emitting device of claim 15, wherein the first electrode pad and the second electrode pad include a bonding layer.

17. The light emitting device of claim 16, wherein the bonding layer comprises Ti, Cr or Ni layer.

18. The light emitting device of claim 16, wherein the first electrode pad and the second electrode pad further include a conductive layer comprising Al, Cu, Ag or Au layer.

19. The light emitting device of claim 14, further including:
a reflective sheet placed near a side surface of the light emitting device.

20. The light emitting device of claim 13, wherein the second insulation layer is composed of multiple layers.

21. The light emitting device of claim 20, wherein the multiple layers include a distributed Bragg reflector in which materials having different indexes of refraction are alternatively stacked one above another.

22. The light emitting device of claim 13, wherein the first insulation layer and the second insulation layer are made from different materials.

23. The light emitting device of claim 22, wherein the first insulation layer comprises SiO2 while the second insulation layer comprises SiNx.

24. The light emitting device of claim 13, further including:
a heat dissipation pad to allow heat to be dissipated upon light emission.

* * * * *